(12) United States Patent
Zhu et al.

(10) Patent No.: US 12,550,391 B2
(45) Date of Patent: Feb. 10, 2026

(54) SEMICONDUCTOR APPARATUS HAVING STAGGERED STRUCTURE AND METHOD OF MANUFACTURING THE SAME, AND ELECTRONIC DEVICE

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Xuezheng Ai, Beijing (CN); Yongkui Zhang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 589 days.

(21) Appl. No.: 17/925,913

(22) PCT Filed: Mar. 18, 2021

(86) PCT No.: PCT/CN2021/081437
§ 371 (c)(1),
(2) Date: Nov. 17, 2022

(87) PCT Pub. No.: WO2021/232916
PCT Pub. Date: Nov. 25, 2021

(65) Prior Publication Data
US 2023/0187497 A1    Jun. 15, 2023

(30) Foreign Application Priority Data
May 21, 2020    (CN) .......................... 202010429360.9

(51) Int. Cl.
*H01L 29/06*    (2006.01)
*H10D 30/01*    (2025.01)
(Continued)

(52) U.S. Cl.
CPC ......... *H10D 62/121* (2025.01); *H10D 30/024* (2025.01); *H10D 30/6211* (2025.01);
(Continued)

(58) Field of Classification Search
CPC ............. H10D 62/121; H10D 30/6211; H10D 30/6757; H10D 64/017; H10D 84/853; H10D 64/021; H10D 30/024
See application file for complete search history.

(56) References Cited

U.S. PATENT DOCUMENTS 9,735,146 B2    8/2017    Colinge et al.
2019/0198669 A1  6/2019   Park et al.
(Continued)

FOREIGN PATENT DOCUMENTS

CN    111063728 A    4/2020
CN    111106111 A    5/2020
(Continued)

OTHER PUBLICATIONS

International Search Report and Written Opinion for International Patent Application No. PCT/CN2021/081437 dated Jun. 18, 2021, 13 pages with English Translation.
(Continued)

*Primary Examiner* — Victor A Mandala
*Assistant Examiner* — Colleen E Snow
(74) *Attorney, Agent, or Firm* — Christopher R. Christenson; Kelly, Holt & Christenson, P.L.L.C.

(57) ABSTRACT

A semiconductor apparatus having a staggered structure, a method of manufacturing a semiconductor apparatus, and an electronic device including the semiconductor apparatus. The semiconductor apparatus includes a first element and a second element on a substrate. The first element and the second element each include a comb-shaped structure. The comb-shaped structure includes a first portion extending in
(Continued)

a vertical direction relative to the substrate, and at least one second portion extending from the first portion in a lateral direction relative to the substrate and spaced from the substrate. A height of the second portion of the first element in the vertical direction is staggered with respect to a height of the second portion of the second element in the vertical direction. A material of the comb-shaped structure of the first element is different from a material of the comb-shaped structure of the second element.

28 Claims, 14 Drawing Sheets

(51) Int. Cl.
*H10D 30/62* (2025.01)
*H10D 30/67* (2025.01)
*H10D 62/10* (2025.01)
*H10D 64/01* (2025.01)
*H10D 84/85* (2025.01)

(52) U.S. Cl.
CPC ....... *H10D 30/6757* (2025.01); *H10D 64/017* (2025.01); *H10D 64/021* (2025.01); *H10D 84/853* (2025.01)

(56) References Cited

U.S. PATENT DOCUMENTS

2023/0066597 A1* 3/2023 Cheng ................ H10D 84/0167
2023/0420457 A1* 12/2023 Frougier .............. H10D 62/371

FOREIGN PATENT DOCUMENTS

| | | |
|---|---|---|
| CN | 111106165 A | 5/2020 |
| CN | 111180443 A | 5/2020 |
| CN | 111584486 A | 8/2020 |
| JP | 2001160594 A | 6/2001 |

OTHER PUBLICATIONS

First Office Action for Chinese Patent Application No. 202010429360.9 dated Nov. 29, 2021, 12 pages with English Translation.

* cited by examiner

SEMICONDUCTOR APPARATUS HAVING STAGGERED STRUCTURE AND METHOD OF MANUFACTURING THE SAME, AND ELECTRONIC DEVICE

CROSS REFERENCE TO RELATED APPLICATION(S)

This application is a Section 371 National Stage Application of International Application No. PCT/CN2021/081437, filed on Mar. 18, 2021, which claims priority to Chinese Patent Application No. 202010429360.9 entitled "SEMICONDUCTOR APPARATUS HAVING STAGGERED STRUCTURE AND METHOD OF MANUFACTURING THE SAME, AND ELECTRONIC DEVICE" filed on May 21, 2020, the content of which is incorporated herein by reference in its entirety.

TECHNICAL FIELD

The present disclosure relates to a field of semiconductor technology, and in particular, to a semiconductor apparatus having a staggered structure, a method of manufacturing a semiconductor apparatus, and an electronic device including the semiconductor apparatus.

BACKGROUND

Various structures are proposed to meet a challenge of further miniaturization of a semiconductor element, such as a Fin Field Effect Transistor (FinFET) and a Multi-Bridge Channel Field Effect Transistor (MBCFET). For the FinFET, with a further miniaturization, a fin height may be higher and higher, so as to obtain a sufficient driving current and reduce a threshold voltage fluctuation while saving an area. However, if the fin height is too large, many problems may occur, such as a fin collapse, a gap filling, an etching morphology control, etc. For the MBCFET, for the purpose of gate metal filling, a spacing between included nanosheets may not continue to narrow, and a self-heating problem may become serious. In addition, unlike the FinFET, a height of the MBCFET occupied by the spacing between the nanosheets may not be used to enhance a performance of an element, such as an increase of a driving current.

SUMMARY

In view of this, an object of the present disclosure is, at least in part, to provide a semiconductor apparatus having a staggered structure, a method of manufacturing a semiconductor apparatus, and an electronic device including the semiconductor apparatus, so that when a unit area occupied by the element is given, a process of manufacturing an element may be improved and a better performance may be obtained, such as a more stable mechanical structure and an optimized electrical performance.

According to an aspect of the present disclosure, a semiconductor apparatus is provided. The semiconductor apparatus includes a first element and a second element on a substrate. The first element and the second element each include a comb-shaped structure. The comb-shaped structure includes a first portion extending in a vertical direction relative to the substrate, and at least one second portion extending from the first portion in a lateral direction relative to the substrate and spaced from the substrate. A height of the second portion of the first element in the vertical direction is staggered with a height of the second portion of the second element in the vertical direction. A material of the comb-shaped structure of the first element is different from a material of the comb-shaped structure of the second element.

According to another aspect of the present disclosure, a method of manufacturing a semiconductor apparatus is provided, including: arranging an alternating stack of at least one first active layer and at least one second active layer on a substrate; forming a first trench extending in a first direction in the stack, wherein a side wall of the first active layer is exposed in the first trench; forming a third active layer connected with the exposed side wall of the first active layer on a side wall of the first trench; forming in the stack a second trench spaced from the first trench in a second direction intersecting the first direction and extending in the first direction, wherein a side wall of the second active layer is exposed in the second trench; forming a fourth active layer connected with the exposed side wall of the second active layer on a side wall of the second trench; forming in the stack a third trench extending in the first direction between the first trench and the second trench, so that the stack is separated into a first sub stack between the first trench and the third trench and a second sub stack between the second trench and the third trench; removing, via the third trench, the second active layer from the first sub stack by a selective etching, so that the first active layer and the third active layer form a first comb-shaped structure; and removing, via the third trench, the first active layer from the second sub stack by a selective etching, so that the second active layer and the fourth active layer form a second comb-shaped structure.

According to another aspect of the present disclosure, an electronic device including the above-mentioned semiconductor apparatus is provided.

According to embodiments of the present disclosure, the semiconductor element may include a comb-shaped structure. The comb-shaped structure may be used as a channel portion. The first portion of the comb-shaped structure may be similar to a fin in the Fin Field Effect Transistor (FinFET), and the second portion of the comb-shaped structure may be similar to a nanosheet in the nanosheet Field Effect Transistor (FET) or the Multi-Bridge Channel Field Effect Transistor (MBCFET). The semiconductor element according to embodiments of the present disclosure may have advantages of both FinET and nanosheet FET or MBCFET. In the semiconductor element, the first portion and the second portion of the comb-shaped structure may simultaneously provide a current driving ability, so that a performance of the element may be improved and an area may be saved. Moreover, due to a mutual coupling between the first portion and the second portion, a mechanical stability may be better in a manufacturing stage, for example, better than an existing MBCFET.

In addition, a pair of semiconductor elements on the substrate may be complementary with each other. The semiconductor apparatus including the pair of semiconductor elements may be called a complementary Comb Nano-Sheet Field Effect Transistor (cCNSFET).

BRIEF DESCRIPTION OF THE DRAWINGS

The above and other objectives, features and advantages of the present disclosure will be clearer through the following descriptions of embodiments of the present disclosure with reference to the accompanying drawings, wherein:

FIG. 1 to FIG. 24 show schematic diagrams of some stages in a process of manufacturing a semiconductor apparatus according to embodiments of the present disclosure; and FIG. 1 to FIG. 17, FIG. 18(a), FIG. 22(a), FIG. 23 and FIG. 24 are sectional views taken along line AA', FIG. 18(b), FIG. 19, FIG. 20(a), FIG. 21 and FIG. 22(b) are sectional views taken line BB'.

Throughout the accompanying drawings, the same or similar reference numerals indicate the same or similar components.

DETAILED DESCRIPTION OF EMBODIMENTS

Figure 1:
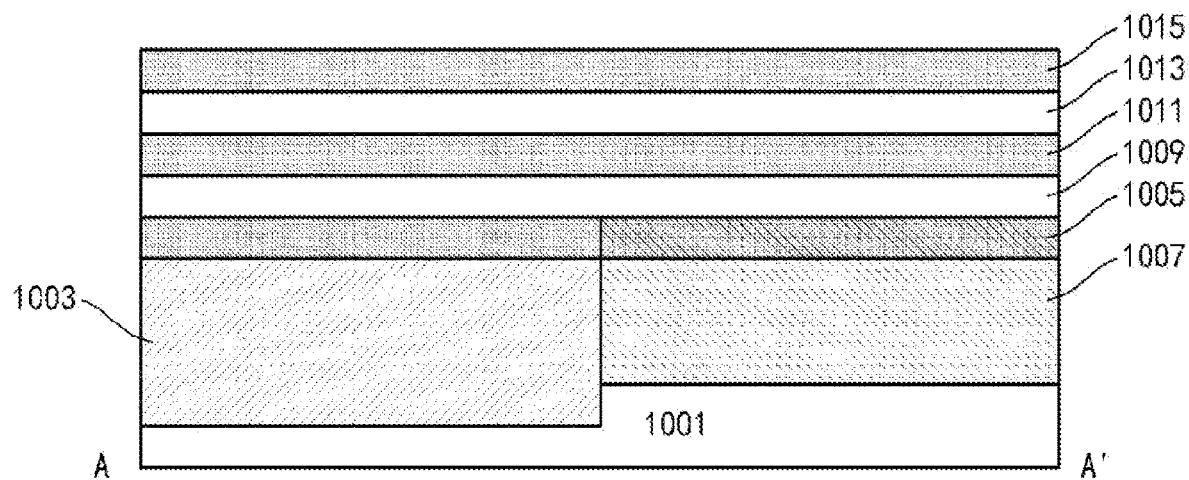

Embodiments of the present disclosure will be described below with reference to the accompanying drawings. It should be understood, however, that these descriptions are merely exemplary and are not intended to limit the scope of the present disclosure. In addition, in the following descriptions, descriptions of well-known structures and technologies are omitted to avoid unnecessarily obscuring the concept of the present disclosure.

Various schematic structural diagrams according to embodiments of the present disclosure are shown in the accompanying drawings. The drawings are not drawn to scale. Some details are enlarged and some details may be omitted for clarity of presentation. Shapes of the various regions, layers as well as a relative size and a positional relationship thereof shown in the drawings are only exemplary. In practice, there may be deviations due to manufacturing tolerances or technical limitations, and those skilled in the art may additionally design regions/layers with different shapes, sizes, and relative positions according to actual needs.

In the context of the present disclosure, when a layer/element is referred to as being located "on" another layer/element, the layer/element may be directly on the another layer/element, or there may be an intermediate layer/element therebetween. In addition, if a layer/element is located "on" another layer/element in one orientation, the layer/element may be located "under" the another layer/element when the orientation is reversed.

According to embodiments of the present disclosure, a semiconductor element having a comb-shaped structure is provided. For example, the comb-shaped structure may include a first portion extending in a vertical direction (for example, a direction substantially perpendicular to a surface of a substrate) relative to the substrate and a second portion extending from the first portion in a lateral direction (for example, a direction substantially parallel to the surface of the substrate) relative to the substrate. The second portion may be spaced from the substrate. At least one second portion may be provided. In a case of providing a plurality of second portions, the second portions are spaced in the vertical direction. The second portion(s) may extend from the first portion to a (same) side of the first portion. Thus, the first portion and the second portions may be generally in a comb shape. The first portion of the comb-shaped structure may be similar to a fin in the Fin Field Effect Transistor (FinFET), and the second portion may be similar to a nanosheet in the nanosheet Field Effect Transistor (FET) or Multi-Bridge Channel Field Effect Transistor (MBCFET).

The so-called "extending laterally" does not necessarily mean extending completely parallel to the surface of the substrate, but may deviate from a certain angle. Similarly, the so-called "extending vertically" does not necessarily mean extending completely perpendicular to the surface of the substrate, but may deviate from a certain angle. The deviation may be, for example, caused by a manufacturing tolerance, a process limitation, etc.

The comb-shaped structure may be used as a channel portion of the semiconductor element. Therefore, the semiconductor element according to embodiments of the present disclosure may have advantages of both FinET and nanosheet FET or MBCFET. In the semiconductor element, the first portion and the second portion of the channel portion may simultaneously provide a current driving ability, so that a performance of the element may be improved and an area may be saved. Moreover, due to a mutual coupling between the first portion and the second portion, a mechanical stability may be better in a manufacturing stage, for example, better than an existing MBCFET.

The semiconductor element may also include source/drain portions arranged on two opposite sides of the channel portion in the first direction, and the source/drain portions are connected with the channel portion to form an active region of the semiconductor element. The source/drain portion may include a same material as that of the channel portion, or may include a different material to apply a stress to the channel portion, for example, so as to enhance the performance of the element. The source/drain portion may be formed by growing from a substrate below and/or a side wall of the channel portion. A top surface of the source/drain portion may be higher than a top surface of the channel portion.

The first portion and/or the second portion of the comb-shaped structure may include a single crystal semiconductor material to improve the performance of the element. For example, the first portion and/or the second portion of the comb-shaped structure may be formed by an epitaxial growth, and thus a thickness of the first portion and/or a thickness of the second portion may be better controlled. The source/drain portion may also include a single crystal semiconductor material. A crystal interface may exist between at least some semiconductor layers grown separately. For example, an observable crystal interface may exist between at least one selected from: the first portion of the comb-shaped structure and the source/drain portion, the second portion of the comb-shaped structure and the source/drain portion, or the first portion and the second portion of the comb-shaped structure.

The semiconductor element may also include a gate stack intersecting the channel portion. The gate stack may extend, from one side of the channel portion to the other side of the channel portion across the channel portion, in a second direction intersecting (e.g., perpendicular to) the first direction. The gate stack may surround the channel portion.

A spacer may be formed on two opposite side walls of the gate stack in the first direction. The gate stack may be spaced from the source/drain portion through the spacer. Outer side walls of the spacer facing the source/drain portion may be substantially coplanar in the vertical direction, and may be substantially coplanar with a side wall of the comb-shaped structure. Inner side walls of the spacer facing the gate stack may be substantially coplanar in the vertical direction, so that the gate stack may have a substantially uniform gate length. The spacer may have a substantially uniform thickness.

The first portion of the comb-shaped structure may extend to be connected with the substrate, so as to suppress a self-heating. In order to suppress a leakage, a portion of the first portion below a portion used as the channel portion in the first portion may form a punch-through stop portion (PTS).

According to embodiments of the present disclosure, the above-mentioned a pair of semiconductor elements may be provided. Second portions of comb-shaped structures of a pair of adjacent semiconductor elements may extend towards or opposite each other. As described below, the second portions of the respective comb-shaped structures of the adjacent semiconductor elements may be obtained from alternately stacked active layers, and thus the second portions may be staggered with each other in the vertical direction. For example, the second portion of the first element may be aligned with a spacing between the second portions of the second element, and the second portion of the second element may be aligned with a spacing between the second portions of the first element. For the two elements, the respective comb-shaped structures may be formed by using different semiconductor materials, which is particularly beneficial when the two elements have different conductive types, because the performances of the elements may be optimized for elements of different conductive types. Therefore, the concept of the present disclosure is particularly applicable to a Complementary Metal Oxide Semiconductor (CMOS) technology, and therefore the semiconductor element according to the present disclosure may be called a complementary Comb Nano-Sheet Field Effect Transistor (cCNSFET).

Such a semiconductor element may be manufactured as follows, for example.

An alternating stack of at least one first active layer and at least one second active layer may be arranged on a substrate. The first active layer may be used to define the second portion (i.e., nanosheet) of the comb-shaped structure of the first element, and the second active layer may be used to define the second portion (i.e., nanosheet) of the comb-shaped structure of the second element. For the first element, the second active layer in the stack may define a spacing between the nanosheets (and thus may be considered as a "sacrificial layer"); and for the second element, the first active layer in the stack may define a spacing between the nanosheets (and thus may be considered as a "sacrificial layer"). Unlike a consistency of the active layer and the sacrificial layer in each element region in an existing technology, according to embodiments of the present disclosure, the active layer and the sacrificial layer may be reversed between different element regions, and therefore a staggered structure may be achieved.

In addition, in order to form a spacing between the lowest active layer (for example, the first active layer) and the substrate, an occupation layer may be arranged on the substrate, and the above-mentioned stack may be formed on the occupation layer. The layers may be formed by an epitaxial growth.

A first trench extending in the first direction may be formed in the stack, and side walls of the first active layer (and the second active layer) are exposed in the first trench. A third active layer connected with the exposed side wall of the first active layer may be formed on a side wall of the first trench. Therefore, the first active layer extending laterally and the third active layer extending vertically may form a first comb-shaped structure together. The first trench may enter the substrate, so that the third active layer formed may be connected to the substrate, which is similar to a fin connected to the substrate in the FinFET. Similarly, a second trench spaced from the first trench in a second direction intersecting (e.g., perpendicular to) the first direction and extending in the first direction may be formed in the stack, and the side walls of the second active layer (and the first active layer) may be exposed in the second trench. A fourth active layer connected with the exposed side wall of the second active layer may be formed on a side wall of the second trench. Therefore, the second active layer extending laterally and the fourth active layer extending vertically may form a second comb-shaped structure together. Similarly, the second trench may enter the substrate, so that the fourth active layer formed may be connected to the substrate, which is similar to the fin connected to the substrate in the FinFET. As described above, as the first comb-shaped structure and the second comb-shaped structure are formed by different active layers, they may be staggered with each other in the vertical direction.

Currently, the first comb-shaped structure and the second comb-shaped structure are connected with each other, and the sacrificial layer is filled between nanosheets of the first comb-shaped structure and nanosheets of the second comb-shaped structure. A third trench may be formed between the first trench and the second trench to separate the first comb-shaped structure from the second comb-shaped structure. The third trench may also extend in the first direction, so that the nanosheets of the first comb-shaped structure and the nanosheets of the second comb-shaped structure may have substantially the same width in the second direction. The second active layer as a sacrificial layer may be removed from the first comb-shaped structure and the first active layer as a sacrificial layer may be removed from the second comb-shaped structure through the third trench, respectively, so that a spacing between the nanosheets of the first comb-shaped structure and a spacing between the nanosheets of the second comb-shaped structure may be released.

The manufacturing of the semiconductor element may be continued based on the obtained first comb-shaped structure and second comb-shaped structure.

Considering an electrical isolation between a subsequently formed gate stack and the substrate, an isolation layer may be formed on the substrate. For example, an isolation layer may be formed at a bottom portion of each of the first trench, the second trench and the third trench. A position of a top surface of the isolation layer in a corresponding element region may be adjusted according to positions of the comb-shaped structures in different element regions.

A sacrificial gate may be formed on the isolation layer, and patterned as a strip extending in the second direction to intersect the comb-shaped structure. A plurality of sacrificial gates spaced in the first direction may be formed, and the sacrificial gates and the comb-shaped structures below may form different semiconductor elements, respectively. The comb-shaped structure may be patterned by using the sacrificial gate as a mask, so that the comb-shaped structure may be left below the sacrificial gate and used as a channel portion. The source/drain portions connected with the comb-shaped structure may be formed by, for example, an epitaxial growth, on two opposite sides of the comb-shaped structure in the first direction on the substrate. The sacrificial gate may be replaced with a real gate stack by a replacement gate process.

The present disclosure may be presented in various forms, some examples of which will be described below. In the following descriptions, a selection of various materials is involved. In the selection of materials, in addition to a function of the material (for example, a semiconductor material is used for forming an active region, a dielectric material is used for forming an electrical isolation), an etching selectivity is also considered. In the following descriptions, a desired etching selectivity may or may not be indicated. It should be clear to those skilled in the art that when etching a material layer is mentioned below, if it is not mentioned or shown that other layers are also etched, then the etching may be selective, and the material layer may have an etching selectivity relative to other layers exposed to the same etching formula.

FIG. 1 to FIG. 24 show schematic diagrams of some stages in a process of manufacturing a semiconductor apparatus according to embodiments of the present disclosure.

As shown in FIG. 1, a substrate 1001 is provided. The substrate 1001 may be a substrate in various forms, including but not limited to a bulk semiconductor material substrate such as a bulk Si or Ge substrate, a semiconductor-on-insulator (SOI) substrate, a compound semiconductor substrate such as a SiGe substrate or a III-V group semiconductor substrate, and the like. In the following descriptions, for ease of explanation, a bulk Si substrate is taken as an example for description.

A well region may be formed in the substrate 1001. If a p-type element is to be formed, a well region may be an n-type well; and if an n-type element is to be formed, the well region may be a p-type well. In this example, a formation of both n-type element and p-type element is taken as an example for description, for example, an n-type element is formed on a left-side region of the substrate in the drawings (therefore, the left-side region in the drawings may be referred to as "a first element region" or "an n-type element region"), while a p-type element is formed on a right-side region of the substrate (therefore, the right-side region in the drawings may be referred to as "a second element region" or "an p-type element region"), respectively. Therefore, wells of two conductive types need to be formed, for example, a p-type well is formed in the first element region and an n-type well is formed in the second element region, respectively. In addition, considering requirements of element (e.g., p-type element) isolation, one (e.g., n-type well) of the wells may extend to an occupation layer (e.g., an occupation layer 1005 described later) subsequently formed on the substrate, and the well may be formed after the occupation layer is formed. Thus, a p-type well 1003 may be, for example, formed in the left-side region of the substrate.

The occupation layer 1005 may be formed on the substrate 1001 by, for example, an epitaxial growth. The occupation layer 1005 may define a spacing with a thickness in a range of, for example, about 3 nm to 15 nm between a nanosheet to be formed subsequently and the substrate, the nanosheet may be used as, for example, a channel portion of the (n-type) element. After the occupation layer 1005 is formed on the substrate 1001, as described above, an n-type well 1007 may be, for example, formed in the right-side regions of the substrate 1001 and the first active layer 1005.

The wells 1003 and 1007 may be formed by, for example, injecting a dopant of a corresponding conductive type (a p-type dopant such as B or $BF_2$, or an n-type dopant such as As or P) into the substrate 1001 (and the occupation layer 1005) and then performing a thermal annealing. A doping concentration in the well may be in a range of about $1E16$ $cm^{-3}$ to $1E19$ $cm^{-3}$. In order to form a localized well in this example, a region in which a dopant does not need to be injected may be masked by using, for example, a photoresist when injecting the dopant. Many ways may be used to provide the well region in the art, which will not be repeated here.

In this example, a bottom portion of the well 1003 is higher than a bottom portion of the well 1007. This is because, for example, the bottom portion of the well 1003 and the bottom portion of the well 1007 are formed by injecting the dopant at approximately the same injection energy but from surfaces at different heights (the well 1003 is injected from a surface of the substrate 1001, and the well 1007 is injected from a surface of the occupation layer 1005). However, the present disclosure is not limited to this. Depending on the injection energy, heights of the bottom portions of the well 1003 and the well 1007 may be approximately the same, or the bottom portion of the well 1007 may be even deeper than the bottom portion of the well 1003.

In this example, a p-type element and an n-type element are simultaneously formed, and the p-type element and the n-type element are adjacent to each other (a Complementary Metal Oxide Semiconductor (CMOS) configuration may then be formed), and the n-type well and the p-type well that are adjacent to each other are formed. However, the present disclosure is not limited to this. For example, an element of a single conductive type may be formed, or elements of different conductive types may be formed in separate regions instead of adjacent to each other.

An alternating stack of the first active layers 1009 and 1013 and the second active layers 1011 and 1015 may be formed on the occupation layer 1005 by, for example, an epitaxial growth. The active layers may then form, for example, nanosheets used as a channel portion of an element, with a thickness in a range of, for example, about 3 nm to 15 nm. When growing the active layers, an in situ doping may be performed to adjust an element threshold. A number of the first active layers and a number of the second active layers in the alternating stack may be changed according to an element design, for example, the number may be more or less. In addition, the number of the first active layers in the stack and the number of the second active layers in the stack need not be the same, and may be different from each other.

The substrate 1001 and adjacent layers of the above-mentioned layers formed thereon may have an etching selectivity relative to each other. For example, the occupation layer 1005 and the second active layers 1011 and 1015 may include SiGe (an atomic percentage of Ge is in a range of, for example, about 15% to 70%), and the first active layers 1009 and 1013 may include Si. In order to facilitate a subsequent processing, the occupation layer 1005 and the second active layers 1011 and 1015 may have the same or similar etching selectivity, such as the same or similar atomic percentage of Ge, so that they may be etched by the same etching formula. A layer on the substrate 1001 formed by the epitaxial growth may include a single crystal semiconductor material.

In this example, the first active layers 1009 and 1013 include Si, which may then be used as a channel portion of the n-type element, and the second active layers 1011 and 1015 include SiGe, which may then be used as a channel portion of the p-type element. However, the present disclosure is not limited to this. For example, the first active layers 1009 and 1013 may include a III-V compound semiconductor material, which may then be used as the channel portion of the n-type element; the second active layers 1011 and 1015 may include Ge, which may then be used as the channel portion of the p-type element. In this case, the substrate 1001 may be a Ge substrate, because it is conducive to a growth of a high-quality or low-defect Ge/III-V family multilayer semiconductor structure.

Figure 2:
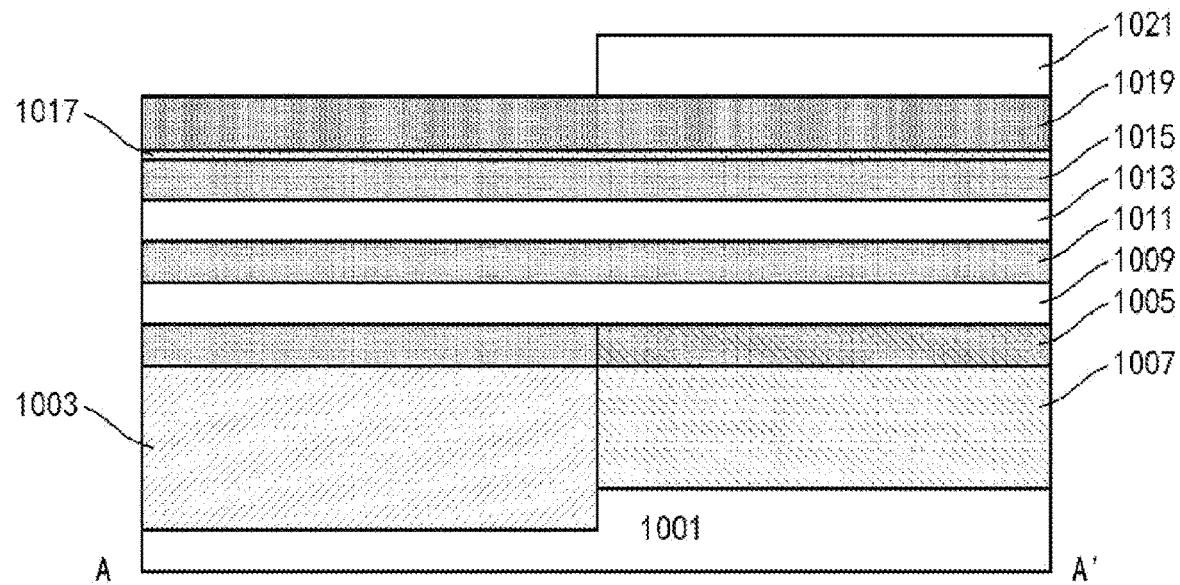

As shown in FIG. 2, a hard mask layer 1019 may be formed on the stack described above by, for example, deposition. For example, the hard mask layer 1019 may include a nitride (for example, silicon nitride) with a thickness in a range of about 20 nm to 100 nm. Before the hard mask layer 1019 of nitride is deposited, a thin etching stop layer 1017, such as an oxide (for example, silicon oxide) or other materials, may also be formed by, for example, deposition.

In this example, for an element (for example, an n-type element) on the left side, the first active layers 1009 and 1013 (Si in this example) may then form, for example, nanosheets used as a channel portion; and for an element (for example, a p-type element) on the right side, the second active layers 1011 and 1015 (SiGe in this example, which is beneficial to a hole mobility) may then form, for example, nanosheets used as a channel portion. In the first element region, in order to avoid that a subsequently formed fin (see 1029 in FIG. 6, especially its vertical extension portion) extends beyond an uppermost nanosheet and thus has a tip in a finally formed comb-shaped structure (which is structurally unstable, and will also lead to asymmetric comb-shaped structures in the first element region and the second element region), other semiconductor layer (if any, the second active layer 1015 in this example) on the uppermost first active layer 1013 may be removed, because a subsequent growth of the fin may also occur on the other semiconductor layer, so that the obtained fin may exceed the uppermost first active layer 1013. In the second element region, as the second active layer 1015 which may subsequently form the nanosheet is currently the uppermost semiconductor layer, the processing is not required. According to different stacking configurations of the first active layers and the second active layers in the stack, the processing may be performed in the second element region rather than in the first element region (for example, when the uppermost layer in the stack is the first active layer).

Figure 3:
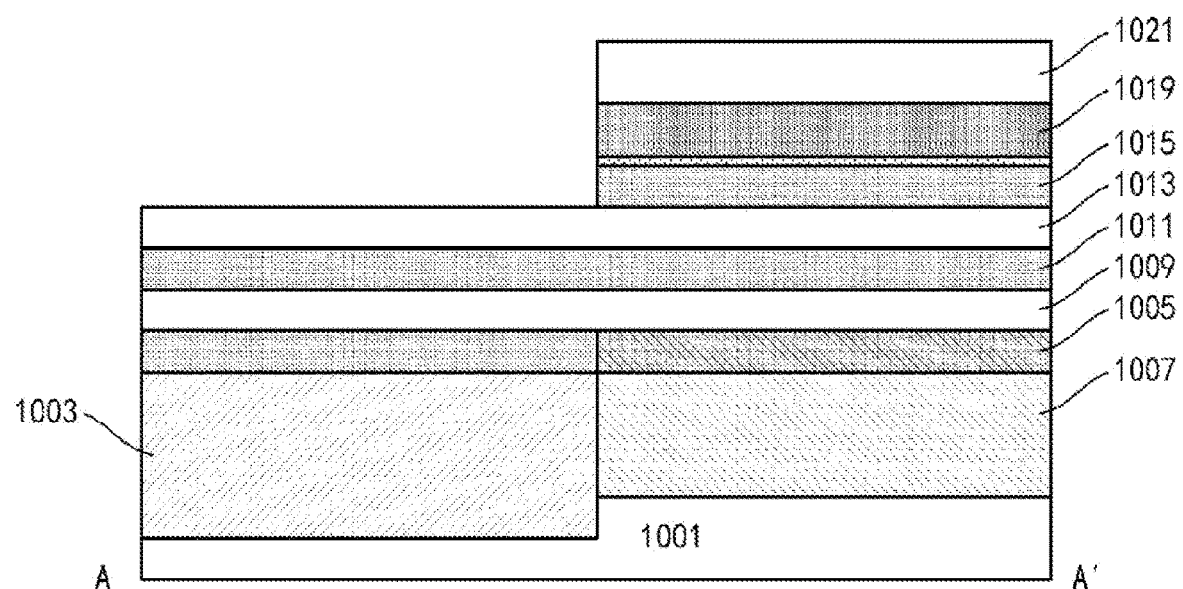

A masking layer, such as a photoresist 1021, may be formed to mask the second element region and expose the first element region. Then, as shown in FIG. 3, the hard mask layer 1019, the etching stop layer 1017 and the second active layer 1015 may be selectively etched sequentially, such as Reactive Ion Etching (RIE), by using the photoresist 1021 as an etching mask. The RIE may be stopped at the first active layer 1013. Thus, in the first element region, the first active layer 1013 becomes the uppermost semiconductor layer. After that, the photoresist 1021 may be removed.

Figure 4:
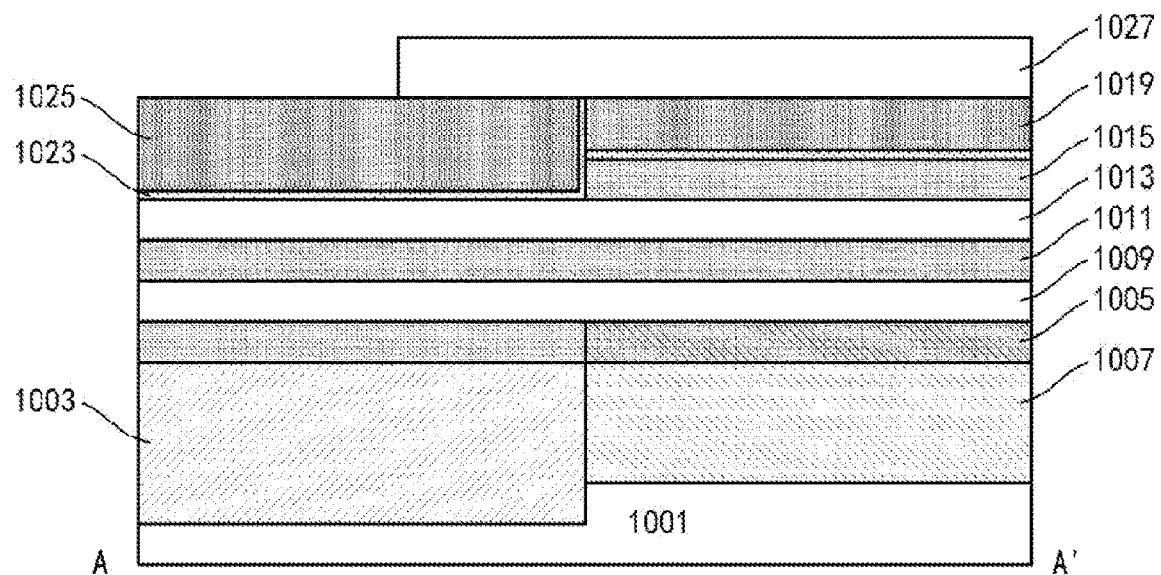

Due to the above-mentioned processing, the hard mask layer is currently defective in the first element region. In order to facilitate the following patterning, as shown in FIG. 4, a hard mask layer 1025 (for example, a nitride) may be formed in the first element region. Similarly, before the hard mask layer 1025 is formed, an etching stop layer 1023 (for example, an oxide) may be formed. For the etching stop layer 1023 and the hard mask layer 1025, please refer to the above description in combination with FIG. 2, which will not be repeated here. In addition, a planarization process such as a Chemical Mechanical Polishing may be performed, so that top surfaces of the hard mask layers 1019 and 1025 may be substantially flat.

As described above, in this example, different active materials are used for different types of elements in order to optimize the performances of the elements. Therefore, in this example, for the different types of elements, fins may be formed to connect nanosheets of the elements (and thus the comb-shaped structures may be formed). That is, processes of forming fins may be performed respectively for the different types of elements.

Figure 5:
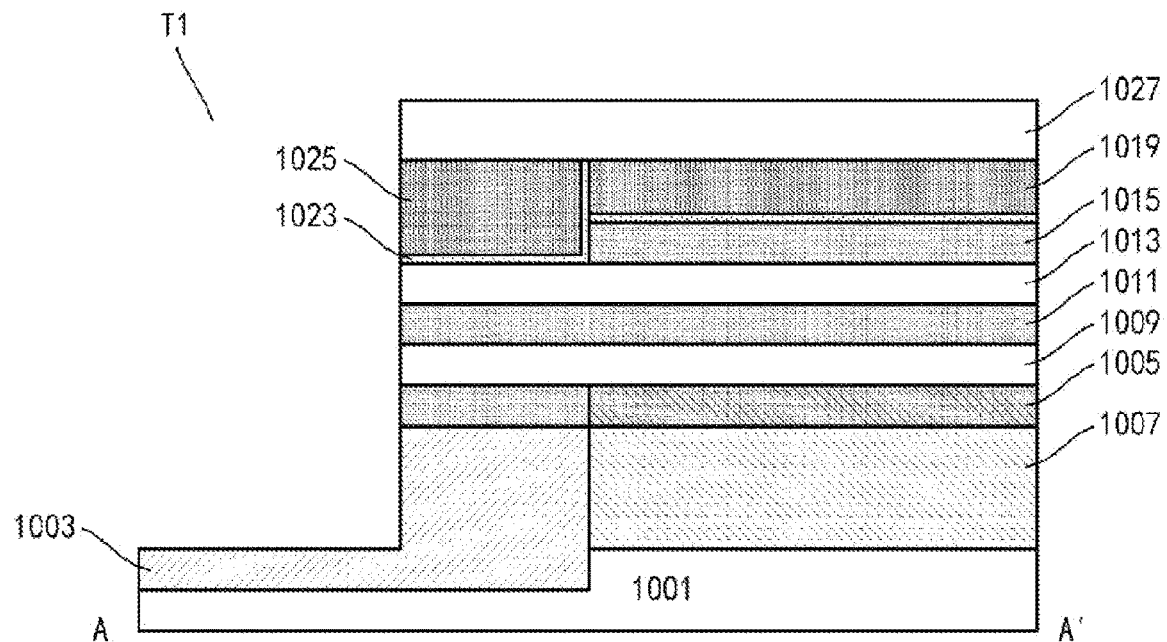

For example, a process of forming a fin may be performed in the first element region. As shown in FIG. 4, a masking layer, such as a photoresist 1027, may be formed to mask the second element region and a region where a nanosheet will be formed subsequently in the first element region, while exposing a region where the fin may be formed in the first element region. Then, as shown in FIG. 5, the photoresist 1027 may be used as an etching mask to selectively etch layers below in sequence, such as RIE, so as to form a trench T1. The trench T1 may extend in a first direction (for example, a direction perpendicular to a paper surface in the drawings). Here, considering, for example, a heat dissipation performance, etc., the trench T1 may enter the substrate 1001, especially the well 1003 therein, so that the subsequently formed fin may be connected with the substrate 1001. The RIE forming the trench T1 may be performed in a vertical direction, so that the trench T1 may have a vertical side wall, and side walls of the first active layers 1009 and 1013 may be exposed in the trench T1. After that, the photoresist 1027 may be removed.

Figure 6:
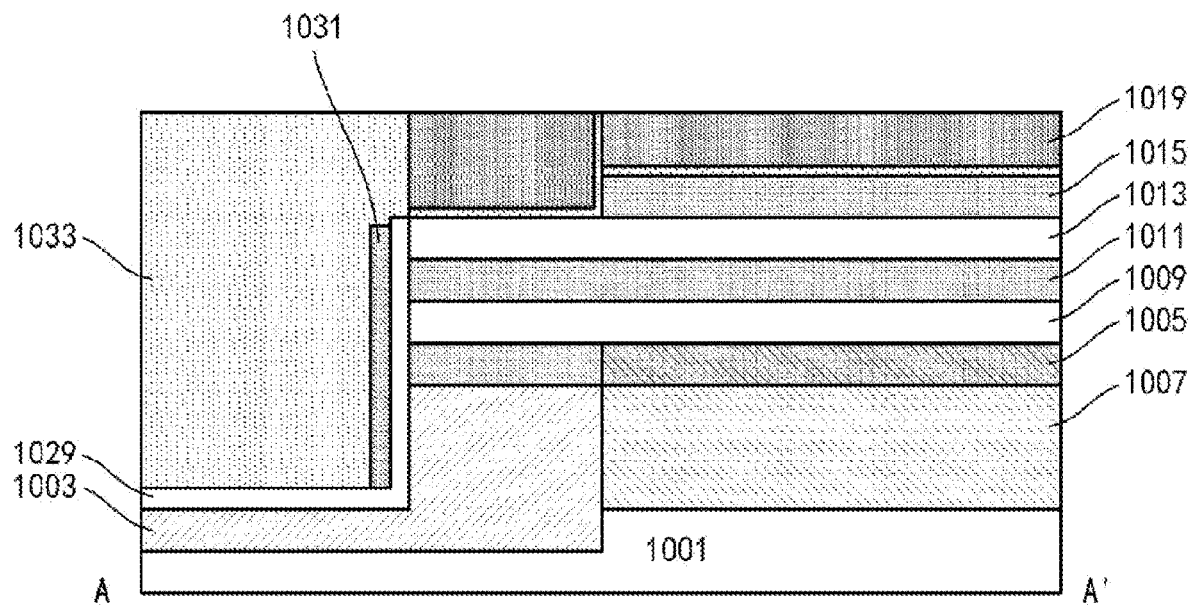

The fin may be formed on the vertical side wall of the trench T1. For example, as shown in FIG. 6, a third active layer 1029 may be formed on a surface of the semiconductor layer exposed in the trench T1 by, for example, a selective epitaxial growth. Due to the selective epitaxial growth, the third active layer 1029 may be formed on a vertical side wall of the stack and the surface of the substrate 1001. A vertical portion of the third active layer 1029 may then form a fin which is used as a channel portion of the element, and the fin has a thickness in a range of, for example, about 3 nm to 15 nm. Different from a thickness of a fin in an existing FinFET usually determined by an etching process, a thickness of the third active layer 1029 (i.e., the fin) according to embodiments of the present disclosure may be determined by an epitaxial growth process, so that the thickness of the fin may be better controlled. In this example, the third active layer 1029 and the first active layers 1009 and 1013 may then form a channel portion together, therefore the third active layer 1029 may include a same material as that of the first active layers 1009 and 1013, such as Si, and thicknesses thereof may be substantially the same. However, the present disclosure is not limited to this.

As described above, as the uppermost second active layer 1015 is removed from the first element region, a top surface of the third active layer 1029 may be substantially flush with a top surface of the uppermost first active layer 1013 without exceeding the top surface of the uppermost first active layer 1013 to form a tip. The tip may also be formed in some embodiments without affecting a following manufacturing process.

In addition, in order to suppress a leakage current, a punch-through stop portion (PTS) (see 1053 shown in FIG. 16) may be formed in a lower portion (that is, a portion below a portion used as a channel in the third active layer 1029) of (a vertical portion of) the third active layer 1029.

The PTS may be achieved by doping the lower portion of the third active layer 1029 with a conductive type opposite to that of the element. The doping may be achieved by, for example, a solid phase doping. For example, as shown in FIG. 6, a first dopant source layer 1031 may be formed by, for example, a spacer forming process. For example, the first dopant source layer 1031 may be an oxide layer containing a p-type dopant such as boron (B) with a concentration in a range of about 0.1% to 5%, and may have a thickness in a range of about 1 nm to 3 nm. The spacer forming process may include depositing substantially conformally a spacer material layer, and an anisotropic etching, such as RIE in the vertical direction, may be performed on the deposited spacer material layer. According to another embodiment, a diffusion barrier layer in a form of a spacer such as a nitride may also be formed outside the first dopant source layer 1031 in the form of the spacer.

After that, the trench T1 may be filled with a filler 1033 of a dielectric material such as an oxide, so as to avoid affecting the layers exposed in the trench T1 when the second element region is processed.

A process of forming a fin may be similarly performed in the second element region.

Figure 7:
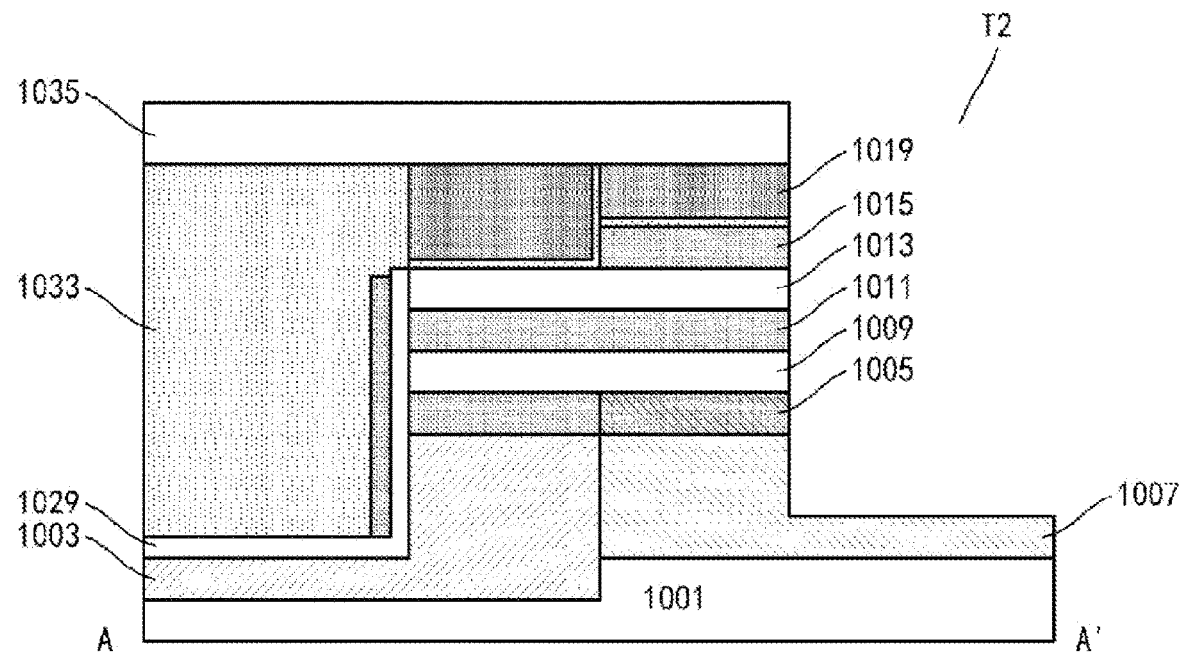

For example, as shown in FIG. 7, a masking layer, such as a photoresist 1035, may be formed to mask the first element region and a region where a nanosheet will be formed subsequently in the second element region, while exposing a region where a fin may be formed in the second element region. The photoresist 1035 may be used as an etching mask to selectively etch layers below in sequence, such as RIE, so as to form a trench T2. The trench T2 may also extend in the first direction (for example, the direction perpendicular to the paper surface in the drawings). Similarly, the trench T2 may enter the substrate 1001, especially the well 1007 therein. The trench T2 may have a vertical side wall, and side walls of the second active layers 1011 and 1015 are exposed in the trench T2. Then, the photoresist 1035 may be removed.

Figure 8:
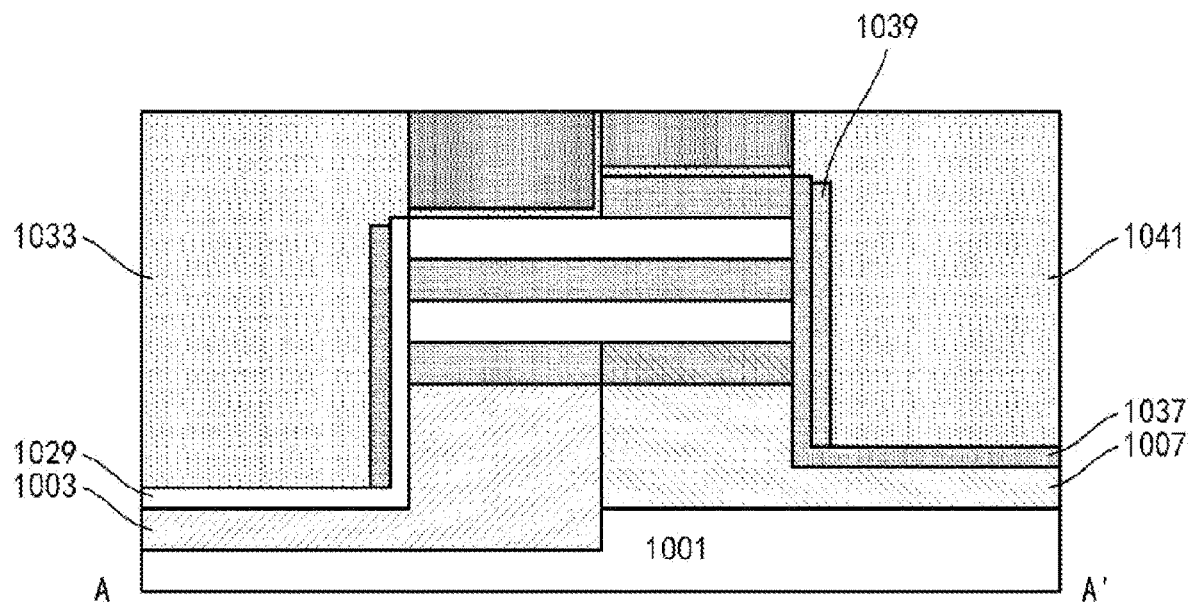

A fin may be formed on the vertical side wall of the trench T2. For example, as shown in FIG. 8, a fourth active layer 1037 may be formed on a surface of the semiconductor layer exposed in the trench T2, for example, by a selective epitaxial growth. A vertical portion of the fourth active layer 1037 may then form a fin which is used as a channel portion of the element, and the fin has a thickness in a range of, for example, about 3 nm to 15 nm. As mentioned above, a thickness of the fourth active layer 1037 (i.e., the fin) according to embodiments of the present disclosure may be determined by the epitaxial growth process, therefore the thickness of the fin may be better controlled. Similarly, in this example, the fourth active layer 1037 and the second active layers 1011 and 1015 may then form a channel portion together, and thus the fourth active layer 1037 may include a same material as that of the second active layers 1011 and 1015, such as SiGe (with the same or similar atomic percentage of Ge), and thicknesses thereof may be substantially the same. However, the present disclosure is not limited to this.

In the second element region, the second active layer 1015 is the uppermost semiconductor layer, a top surface of the fourth active layer 1037 may be substantially flush with a top surface of the uppermost second active layer 1015 without exceeding the top surface of the uppermost second active layer 1015 to form a tip.

Similarly, in order to suppress a leakage current, a PTS (see 1055 shown in FIG. 16) may be formed in a lower portion (that is, a portion below a portion used as a channel in the fourth active layer 1037) of (a vertical portion of) the fourth active layer 1037. Therefore, a second dopant source layer 1039 may be formed by a spacer forming process. For example, the second dopant source layer 1039 may be an oxide layer containing an n-type dopant such as arsenic (As) or phosphorus (P) with a concentration in a range of about 0.1% to 5%, and may have a thickness in a range of about 1 nm to 3 nm. Similarly, a diffusion barrier layer in a form of a spacer such as a nitride may also be formed outside the second dopant source layer 1039 in the form of a spacer.

After that, a filler 1041 may be formed in the trench T2, so as to avoid affecting the layers exposed in the trench T2 during a subsequent processing. The filler 1041 may be subsequently etched by the same etching formula (for example, to form an isolation layer) as the filler 1033, for example, including the same material such as an oxide.

As shown in FIG. 8, in the first element region, the first active layers 1009 and 1013 and the third active layer 1029 form a comb-shaped structure; and in the second element region, the second active layers 1011 and 1015 and the fourth active layer 1037 form a comb-shaped structure. The two comb-shaped structures are currently connected to each other. A separation of the two comb-shaped structures may be achieved between the two regions.

Figure 9:
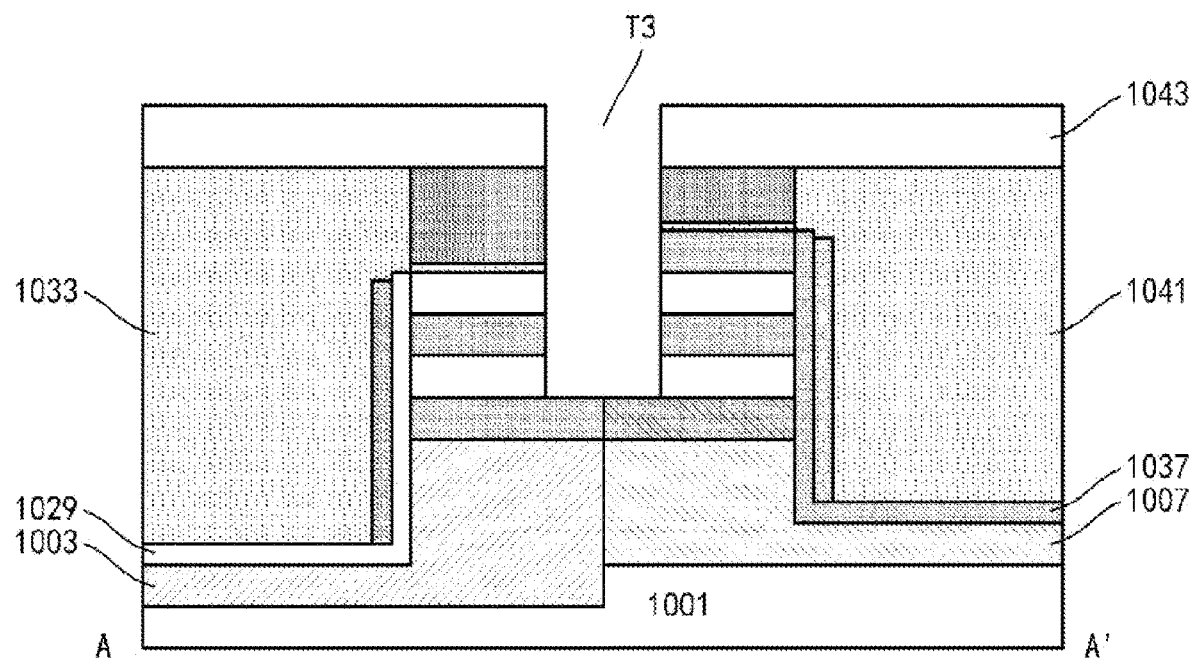

For example, as shown in FIG. 9, a masking layer, such as a photoresist 1043, may be formed to mask the first element region and the second element region, while exposing a region between them. The photoresist 1043 may be used as an etching mask to selectively etch the layers below in sequence, such as RIE, so as to form a trench T3. The trench T3 may also extend in the first direction, so as to define nanosheets with substantially a same width between the trench T1 and the trench T3, and define nanosheets with substantially a same width between the trench T2 and the trench T3. The etching to form the trench T3 may be stopped at the occupation layer 1005. A separation of the two elements may be achieved through the trench T3. In addition, the trench T3 also forms a processing channel for removing material layers (for example, the second active layer in the first element region and the first active layer in the second element region) between comb teeth in the comb-shaped structure. Then, the photoresist 1043 may be removed.

Due to a complementary relationship between the material layers in the two element regions (in the first element region, the first active layer is used as the channel portion, and the second active layer is used to define a spacing between the first active layers and need to be removed; and in the second element region, the second active layer is used as the channel portion, and the first active layer is used to define a spacing between the second active layers and need to be removed), removal processes may be performed in the two element regions, respectively. When performing a removal process on one of the elements, a relevant layer in the other element region needs to be masked or protected through a protective layer.

Figure 10:
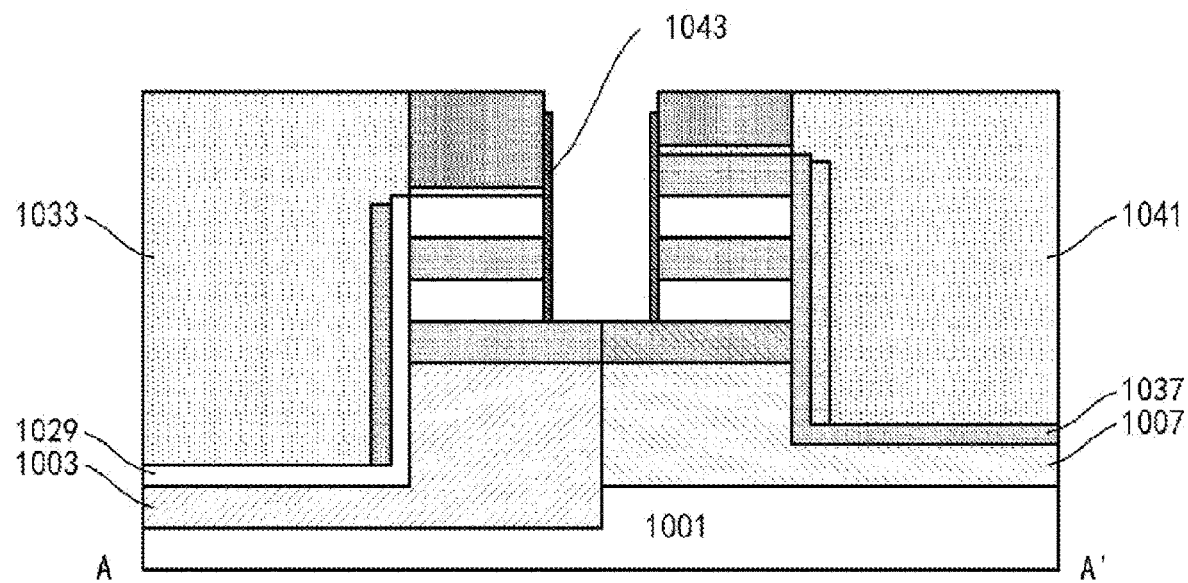
Figure 11:
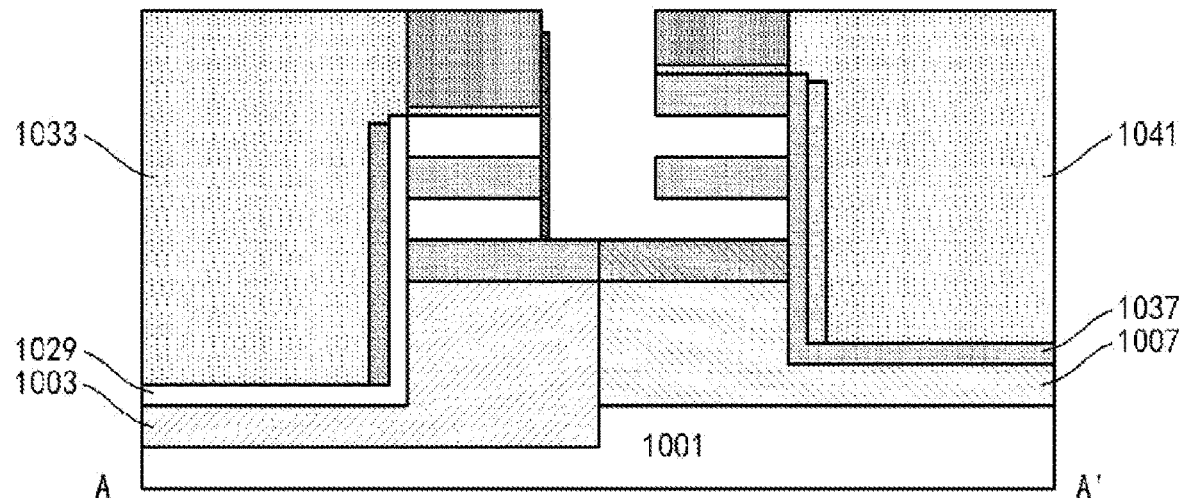

For example, as shown in FIG. 10, a protective layer 1043 may be formed on a side wall of the trench T3, such as a SiC film with a thickness in a range of about 1 nm to 5 nm, by a spacer forming process. Then, as shown in FIG. 11, the protective layer 1043 in the second element region may be removed in combination with lithography. Therefore, the protective layer 1043 may be left in the first element region and cover the side walls of the first active layers 1009 and 1013. In the second element region, the side walls of the first active layers 1009 and 1013 may be exposed through the trench T3. The first active layers 1009 and 1013 may be removed from the second element region by a selective etching, such as a wet etching with a TMAH solution, relative to the second active layers 1011 and 1015 (and the occupation layer 1005).

As shown in FIG. 11, in the second element region, the second active layers 1011 and 1015 (nanosheets) and the fourth active layer 1037 (especially its vertical portion, that is, the fin) form a comb-shaped structure. A width of the nanosheet may be adjusted by adjusting a spacing between the trench T3 and the trench T2, and therefore a current driving ability of the finally formed element may be adjusted. According to an embodiment, the second active layers 1011 and 1015 and the fourth active layer 1037 may be thinned by a selective etching, so as to improve the performance of the element, such as a suppression of short channel effect. In order to control an etching amount better, an Atomic Layer Etching (ALE) may be used.

A filler (see FIG. 12) may be formed in a gap formed by a removal of the first active layers 1009 and 1013 in the second element region, so as to provide a structural support for the second active layers 1011 and 1015 in a subsequent processing. Filling may be achieved by deposition and then etching back. During an etching back process, the protective layer 1043 may be removed. The filler and the protective layer 1043 may be etched by the same etching formula, for example, they include the same material such as SiC.

A presence of the occupation layer 1005 may protect the substrate 1001 (in this example, the substrate has the same Si as the first active layers 1009 and 1013) from being affected. This is also the reason why the removal process is first performed in the second element region in this example. However, the present disclosure is not limited to this, especially in a case that the first active layers 1009 and 1013 have an etching selectivity relative to the substrate.

After that, a removal process may be similarly performed in the first element region.

Figure 12:
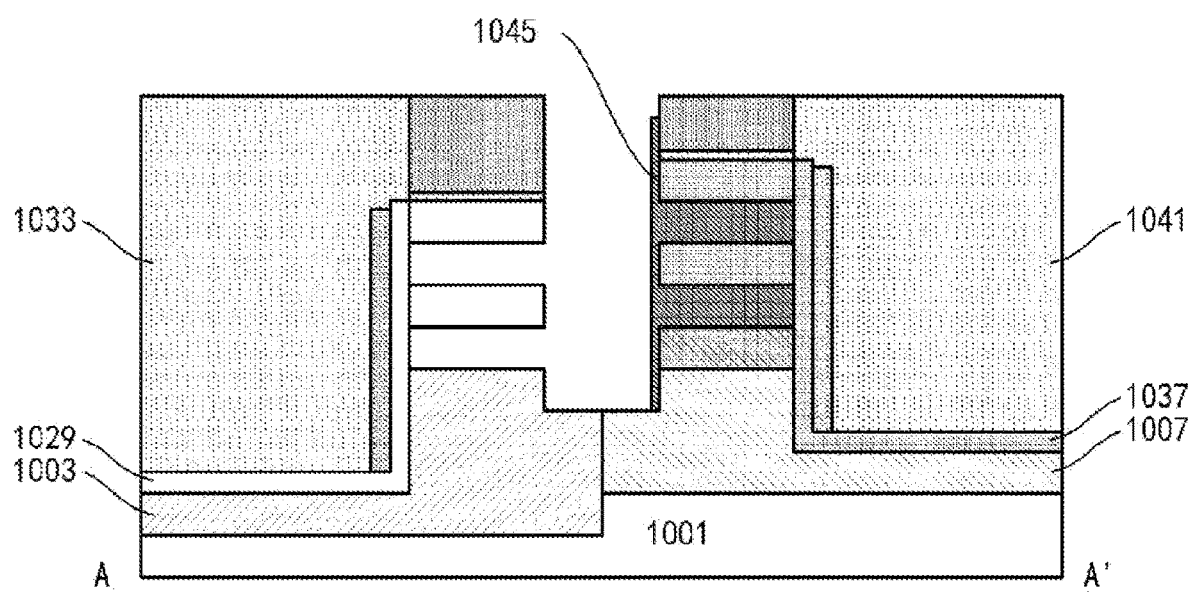

Considering that the occupation layer 1005 may be removed in the first element region (so as to leave a space below the lowest first active layer 1009, so that a gate stack surrounding the first active layer 1009 may be formed subsequently), the trench T3 may be deepened to expose a side wall of the occupation layer 1005, so that the occupation layer 1005 may be better removed. Specifically, in a presence of the hard masks 1019 and 1025, the trench T3 may be deepened by a selective etching, such as RIE. The RIE for deepening the trench T3 may be stopped at the substrate 1001 or enter the substrate 1001, especially the wells 1003 and 1007 therein. Then, as described above in combination with FIG. 10 and FIG. 11, a protective layer, such as SiC, may be similarly formed on the side wall of the trench T3 in the second element region. The protective layer is shown as 1045 together with the filler previously filled in the gap between the second active layers 1011 and 1015, as shown in FIG. 12. After that, the second active layer 1011 and the occupation layer 1005 may be removed from the first element region by a selective etching relative to the first active layers 1009 and 1013 (and the substrate 1001).

As shown in FIG. 12, in the first element region, the first active layers 1009 and 1013 (nanosheets) and the third active layer 1029 (especially its vertical extension portion, that is, the fin) form a comb-shaped structure. A width of the nanosheet may be adjusted by adjusting a spacing between the trench T3 and the trench T1, and therefore a current driving ability of the finally formed element may be adjusted. Similarly, the first active layers 1009 and 1013 and the third active layer 1029 may be thinned by a selective etching, such as ALE, so as to improve the performance of the element, such as a suppression of short channel effect.

As described above, as the material layers in the two element regions are mutually complementary, a comb portion of the comb-shaped structure in the first element region may be aligned with a spacing between comb portions of the comb-shaped structure in the second element region, and vice versa.

Figure 13:
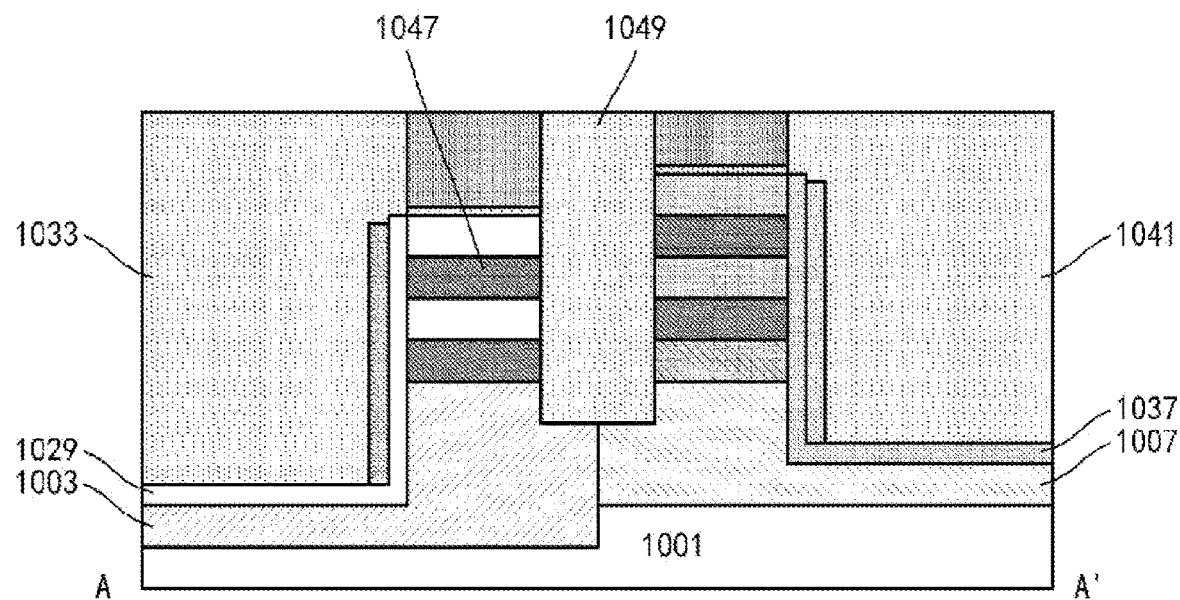

As shown in FIG. 13, a filler 1047 may be formed in a gap formed by a removal of the second active layer 1011 and the occupation layer 1005 in the first element region, so as to provide a structural support for the first active layers 1009 and 1013 in a subsequent processing. In order to facilitate a subsequent replacement gate process, the filler 1047 and the filler (marked as 1045 in FIG. 12) in the second element region may be removed by the same etching formula, for example, they include the same material such as SiC. Filling may be achieved by deposition and then etching back. In an etching back process, the protective layer formed on the side wall of the trench T3 as shown in FIG. 12 may be removed.

In addition, the filler 1049 may be formed in the trench T3. The filler 1049 may be subsequently etched by the same etching formula (for example, to form an isolation layer) as the above-mentioned fillers 1033 and 1041, for example, including a same material such as an oxide. When the filler 1049 is formed, a planarization process such as CMP may be performed (the CMP may be stopped at the hard mask layers 1019 and 1025), so that the filler 1033, 1041 and 1049 may have substantially flat top surfaces.

Figure 14:
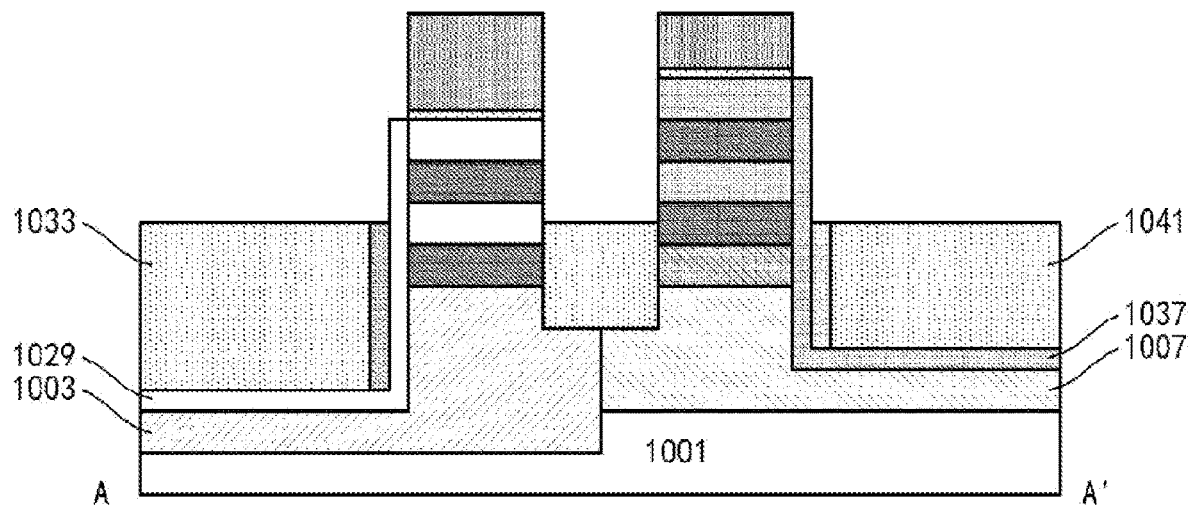

As shown in FIG. 14, an isolation layer may be formed by etching back the fillers 1033, 1041 and 1049, such as RIE. As the above-mentioned fillers 1033, 1041 and 1049 may have substantially flat top surfaces, etched-back top surfaces of the fillers 1033, 1041 and 1049 may also be substantially flat. In this example, as active layers of two elements are different in height, isolation layers around them may have different top surface heights. Here, the second active layer 1011 as the lowest nanosheet in the second element region is higher than the first active layer 1009 as the lowest nanosheet in the first element region, and thus a top surface of the isolation layer in the second element region may be higher than a top surface of the isolation layer in the first element region. Therefore, the top surface of the isolation layer in the second element region may be first defined here (because the top surfaces are etched from top to bottom). For example, after etching back, the top surface of the isolation layer may be lower than a bottom surface of the second active layer 1011, but higher than a top surface of the occupation layer 1005, that is, between the top surface and the bottom surface of the first active layer 1009. This is mainly to consider positions of the PTS (see 1055 shown in FIG. 16) subsequently defined by the isolation layer (more specifically, the filler 1041) and a gate stack subsequently formed on the isolation layer. If the top surface of the isolation layer (more specifically, the filler 1041) is higher than the bottom surface of the second active layer 1011, then a top surface of the formed PTS (see 1055 shown in FIG. 16) may be higher than the bottom surface of the second active layer 1011. If the top surface of the isolation layer (more specifically, the filler 1041) is lower than the top surface of the occupation layer 1005, then for a portion of the fourth active layer 1055 that is lower than the top surface of the occupation layer 1005, the gate stack may only be formed on one side (the right side in the drawings) (the gate stack may not be formed on the left side in the drawings due to a presence of the occupation layer 1005). These are unfavorable for the performance of the element.

In addition, the first dopant source layer 1031 and the second dopant source layer 1039 (here, both are oxides as the isolation layer) may also be etched back, so that top surfaces thereof are substantially flush with the top surface of the isolation layer.

Figure 15:
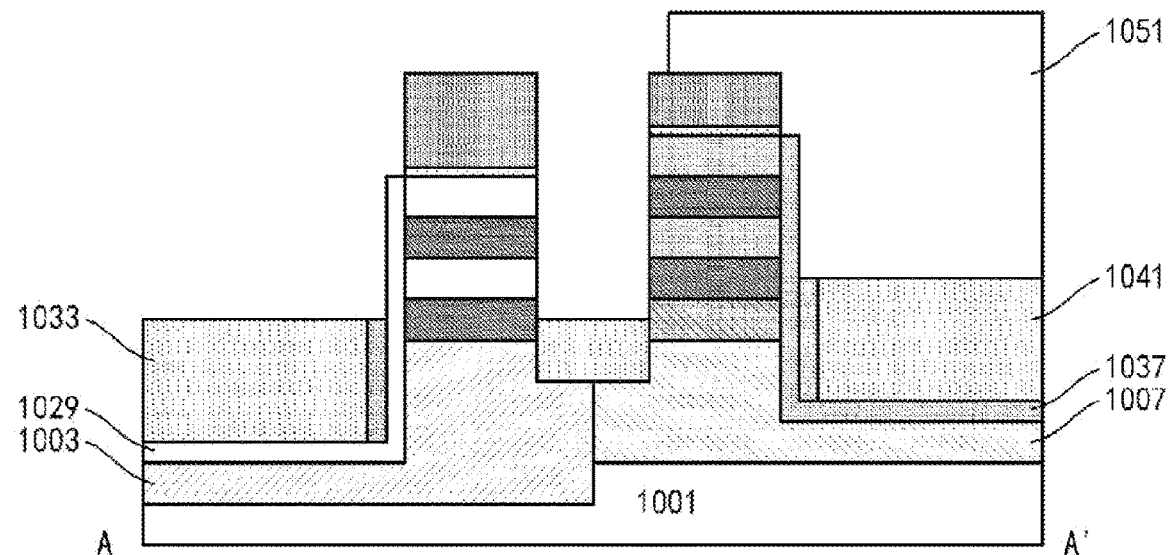

As described above, the top surface of the isolation layer may be relatively low in the first element region. For example, as shown in FIG. 15, the filler 1041 may be marked by a masking layer such as a photoresist 1051, and the fillers 1033 and 1049 may be further etched back. Thus, the top surfaces of the isolation layers in the first element region (and a region between the two element regions) may be lowered, and for the same reason, may be lower than a bottom surface of the lowest first active layer 1011 in the first element region and higher than a top surface of the substrate 1001, that is, between the top surface and the bottom surface of the occupation layer 1005. Similarly, the first dopant source layer 1031 in the first element region may also be etched back, so that a top surface of the first dopant source layer 1031 is substantially flush with the top surface of the isolation layer in the first element region. After that, the photoresist 1051 may be removed.

Figure 16:
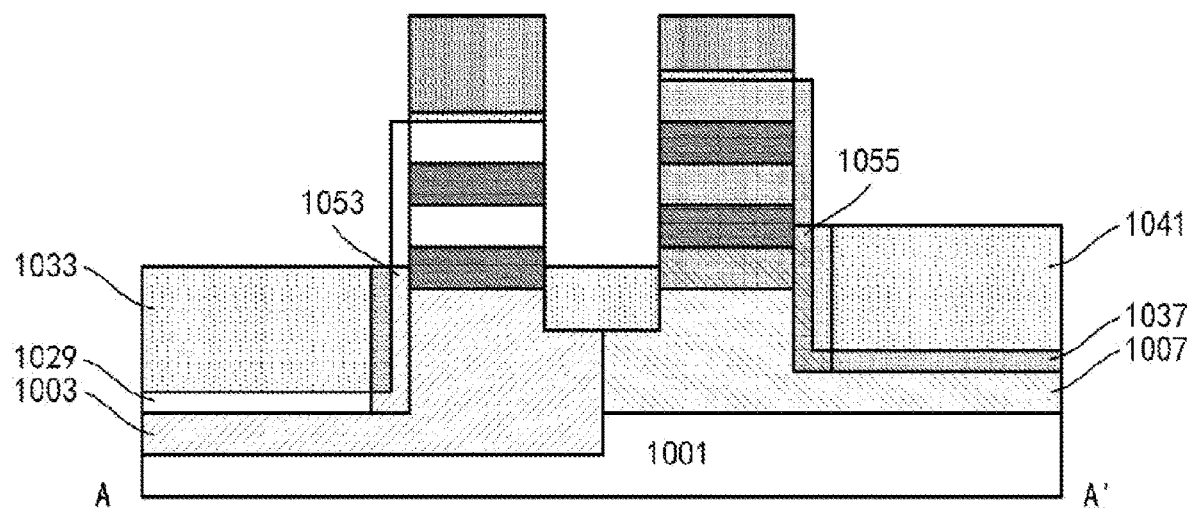

After the isolation layers are defined in the first element region and the second element region, the PTS may be formed. As shown in FIG. 16, dopants in the dopant source layers 1031 and 1039 may be driven into the third active layer 1029 and the fourth active layer 1037 through an annealing treatment, and the PTS 1053 and 1055 may be formed in the third active layer 1029 and the fourth active layer 1037 respectively. Through the above-mentioned treatment, the top surfaces of the dopant source layers 1031 and 1039 are substantially flush with the top surfaces of the isolation layers, so that top surfaces of the formed PTS 1053 and 1055 may be near the top surfaces of the isolation layers, or slightly exceed the top surfaces of the isolation layers due to, for example, an upward diffusion. Portions of the third active layer 1029 and the fourth active layer 1037 above the top surfaces of the isolation layers, especially the top surfaces of the PTS 1053 and 1055, may be used as channel portions.

According to other embodiments, a solid phase doping technology may not be used, that is, the dopant source layers 1031 and 1039 need not be formed (current positions thereof may be occupied by the isolation layers). Ion implantation may be performed towards the isolation layers, and ions injected into the isolation layers may be scattered into portions, adjacent to the isolation layers, in the third active layer 1029 and the fourth active layer 1037. For the first element region and the second element region, the ion implantation may be performed respectively. After that, implanted dopants may be activated by annealing.

Next, a replacement gate process may be performed.

Figure 17:
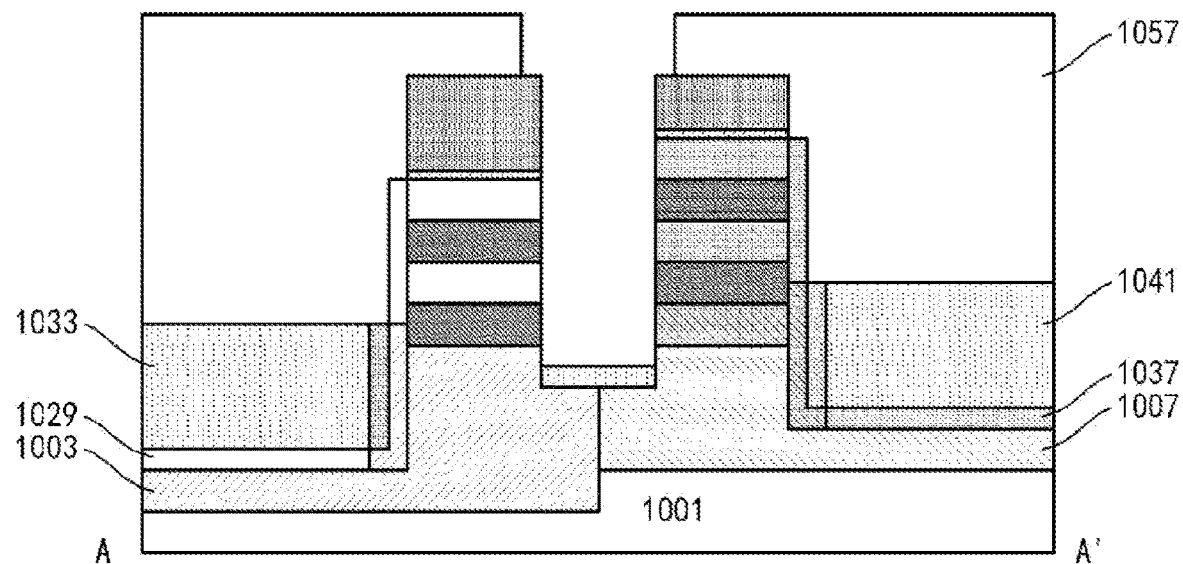

In order to facilitate the replacement gate process, as shown in FIG. 17, isolation layers in the first element region and the second element region (more specifically, the fillers 1033 and 1041) may be masked through a masking layer such as a photoresist 1057, and an isolation layer between the two element regions (more specifically, the filler 1049) may be exposed. The exposed isolation layer may be etched back, such as RIE, so as to fully expose the fillers 1045 and 1047 currently filled between the active layers. For example, a top surface of the etched-back isolation layer may be below a bottom surface (i.e., the bottom surface of the occupation layer 1005) of the lowest filler 1047. After that, the photoresist 1057 may be removed.

A sacrificial gate may be formed on the isolation layers. Before the sacrificial gate is formed, the etching stop layer 1017 and the hard mask layer 1019 on the top surface of the comb-shaped structures may be removed by a selective etching, such as RIE, so that the subsequently formed sacrificial gate may surround the comb-shaped structures. After that, the sacrificial gate may be formed by deposition on the isolation layers. For example, the fillers 1045 and 1047 may be removed by the selective etching, and the sacrificial gate surrounding the comb-shaped structures may be formed. In order to simplify the process, as shown in FIG. 18(*a*), FIG. 18(*b*) and FIG. 18(*c*), a material the same as or similar to the fillers 1045 and 1047 may be deposited on the isolation layers (and then may be etched by the same etching formula to be replaced with the gate stack), and may form a sacrificial gate (which is integrally shown as 1059) together with the fillers 1045 and 1047.

Figure 18A:
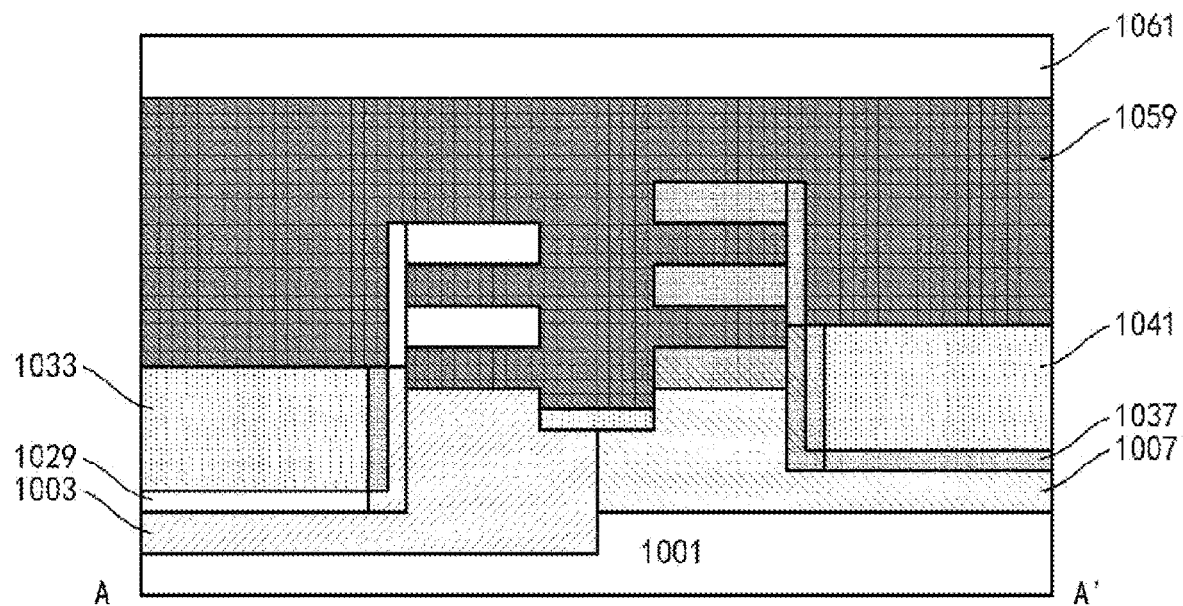
Figure 18B:
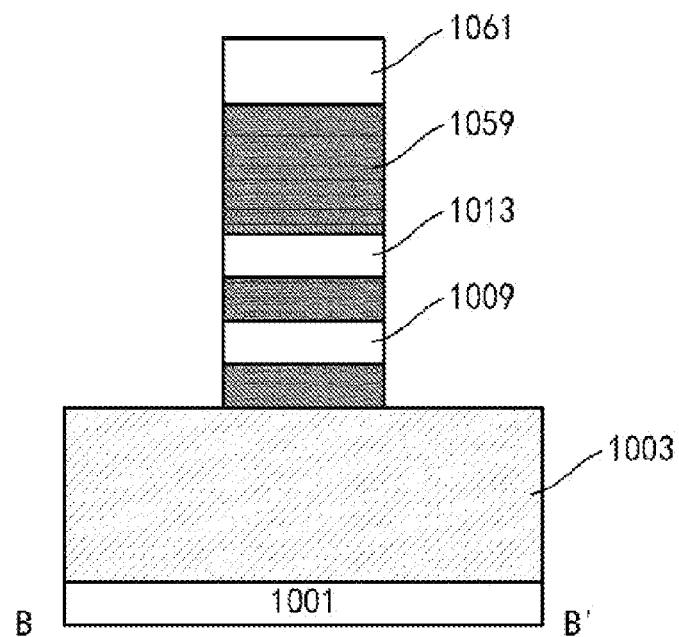
Figure 18C:
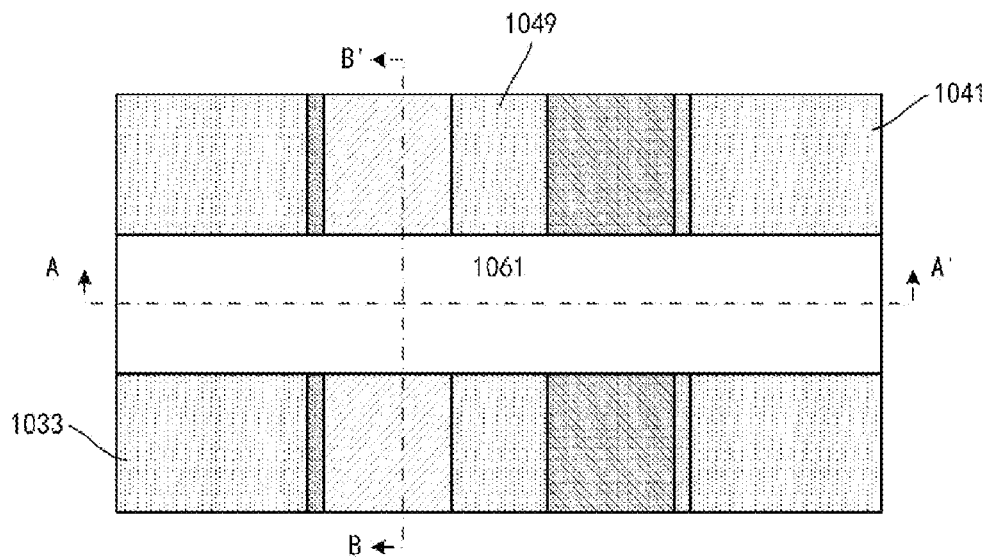
FIG. 18(c) and FIG. 20(b) are top views, and positions of line AA' and line BB' are shown in FIG. 18(c).

The sacrificial gate 1059 may be patterned as a strip extending in a second direction (for example, a horizontal direction in a paper surface in a top view of FIG. 18(*c*)) intersecting (e.g., perpendicular to) the first direction. For example, a photoresist 1061 may be formed on the sacrificial gate 1059, and patterned as a strip extending in the second direction. The sacrificial gate 1059 and the active layers may be etched sequentially through a selective etching, such as RIE, by using the photoresist 1061 as an etching mask. The etching may be stopped at the isolation layers. Thus, the sacrificial gate 1059 may be patterned as the strip extending in the second direction. After that, the photoresist 1061 may be removed.

Figure 19:
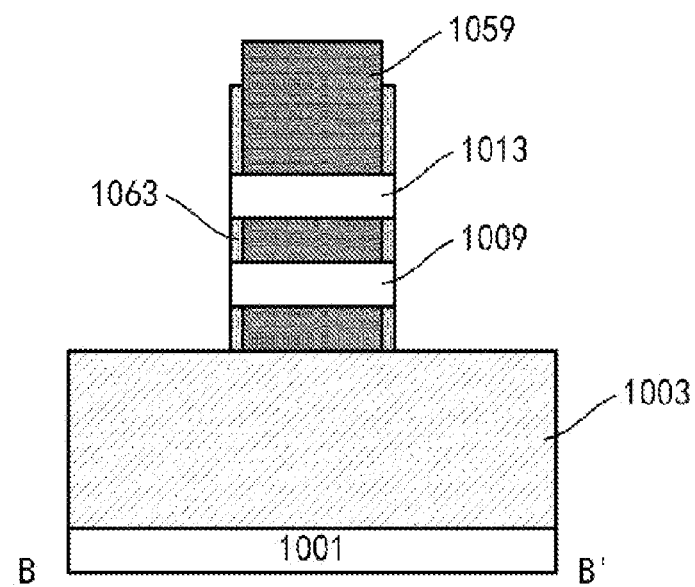

A gate spacer may be formed on a side wall of the sacrificial grating 1059. For example, as shown in FIG. 19, the sacrificial gate 1059 may be recessed to a certain depth, for example, about 2 nm to 7 nm, (relative to the comb-shaped structure) in the first direction by the selective etching. In order to control a recessed depth, an ALE may be used. A dielectric material may be used to fill in the recess thus formed, so as to form a gate spacer 1063. The filling may be formed by, for example, depositing a nitride with a thickness in a range of about 3 nm to 10 nm, and then performing the RIE on the deposited nitride (until the side wall of the comb-shaped structure is exposed).

According to the process, the gate spacer 1063 may be formed on the side wall of the sacrificial gate 1059 by self-aligning, but not on the side wall of the comb-shaped structure. The gate spacer 1063 may have a substantially uniform thickness, which may depend on, for example, the above-mentioned recessed depth. In addition, outer side walls of the gate spacer 1063 may be substantially vertically aligned with outer side walls of the first and second active layers, and inner side walls of the gate spacer 1063 may be substantially aligned in the vertical direction (which may be achieved by controlling substantially the same etching depth everywhere when a recess is formed).

Then, source/drain portions connected with the side walls of the comb-shaped structures may be formed on both sides of the sacrificial gate 1059.

Figure 20A:
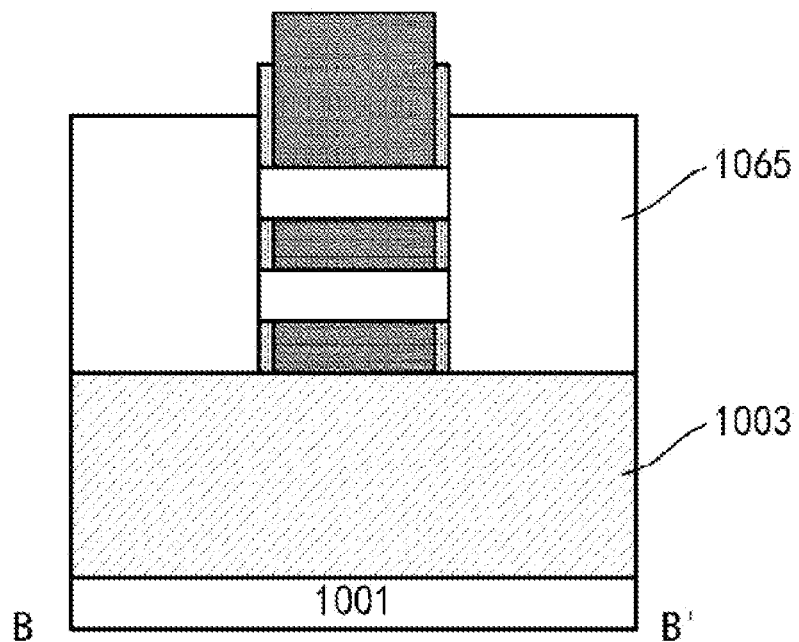
Figure 20B:
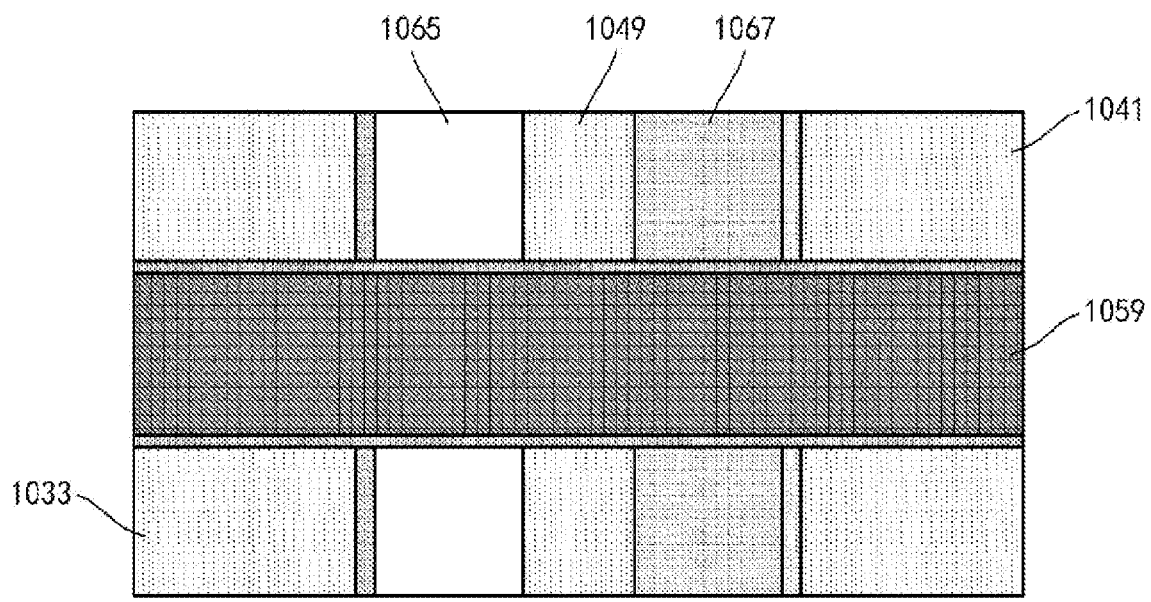

As shown in FIG. 20(*a*) and FIG. 20(*b*), a first source/drain portion 1065 and a second source/drain portion 1067 may be formed by, for example, a selective epitaxial growth, in the first element region and the second element region, respectively. The first source/drain portion 1065 and the second source/drain portion 1067 may be respectively grown from side walls of the exposed comb-shaped structures. The grown first source/drain portion 1065 and second source/drain portion 1067 are respectively connected with the side walls of the comb-shaped structures. During the growth, the first source/drain portion 1065 and the second source/drain portion 1067 may be doped in situ as conductive types corresponding to the elements to be formed. For example, the first source/drain portion 1065 may be doped as n-type, the second source/drain portion 1067 may be doped as p-type, and a doping concentration may be in a range of about $1E19$ $cm^{-3}$ to $1E21$ $cm^{-3}$.

The grown first source/drain portion 1065 and the grown second source/drain portion 1067 may include a material different from that of respective comb-shaped structures (e.g., having different lattice constants), so as to apply a stress to the comb-shaped structures. For example, the first source/drain portion 1065 may include Si:C (an atomic percentage of C is in a range of, for example, about 0.05% to 2%), and the second source/drain portion 1067 may include SiGe (an atomic percentage of Ge is in a range of, for example, about 20% to 70%). In this example, the n-type element and the p-type element are simultaneously formed on the substrate, and source/drain portions may be respectively grown for the n-type element and the p-type element. When a source/drain portion of one type of element is grown, a region of the other type of element may be masked by a masking layer such as a photoresist or the like. The first source/drain portion 1065 and the second source/drain portion 1067 may also include the same material, such as Si.

According to other embodiments of the present disclosure, the comb-shaped structure may be etched back to a certain extent (for example, in a range of about 2 nm to 5 nm) before the source/drain portion is grown. In this way, the grown (doped) semiconductor layer may enter a space (overlapping with the sacrificial gate and therefore with the gate stack that subsequently replaces the sacrificial gate) caused by the etching back of the comb-shaped structure, which may help to improve the performance of the element.

Figure 21:
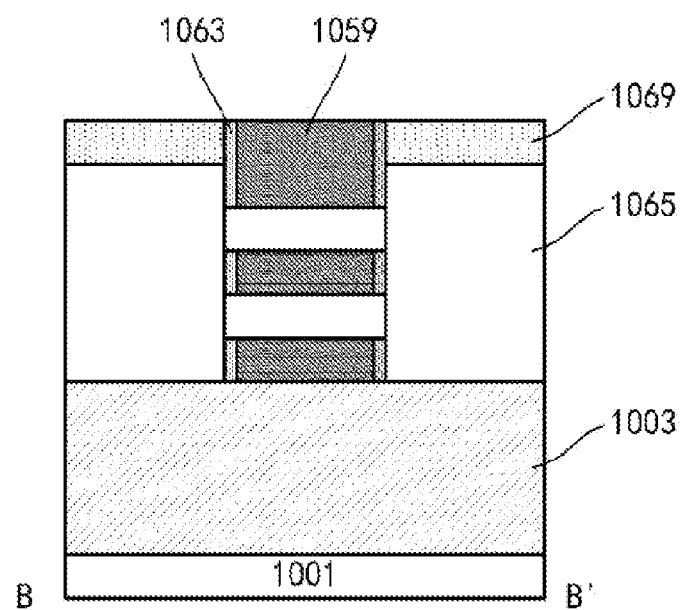

In addition to the grown source/drain portions, there are gaps between strip sacrificial gates, and a dielectric material may be filled in the gaps to form an interlayer dielectric layer. For example, as shown in FIG. 21, an interlayer dielectric layer 1069 may be formed by, for example, deposition and then planarization (which may be stopped at the gate spacer 1063). For example, the interlayer dielectric layer 1069 may include an oxide.

Next, the sacrificial gate 1059 may be replaced with a gate stack to complete a element manufacturing.

Figure 22A:
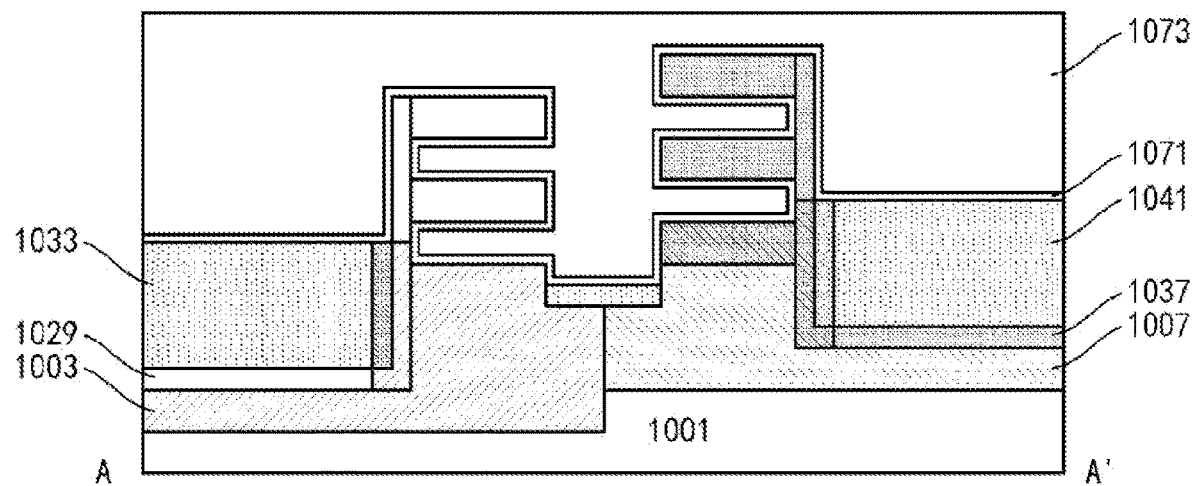
Figure 22B:
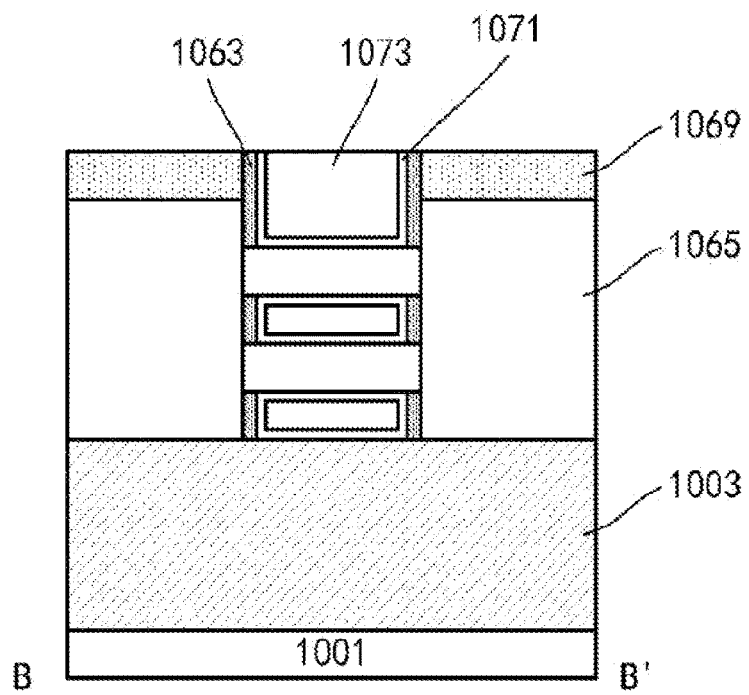

For example, as shown in FIG. 22(a) and FIG. 22(b), the sacrificial gate 1059 may be removed by a selective etching, so that a gate trench may be formed on an inner side of the gate spacer 1063, and the gate stack may be formed in the gate trench. For example, a gate dielectric layer 1071 and a gate conductor layer 1073 may be sequentially deposited in the gate trench. The gate dielectric layer 1071 may be formed in a substantially conformal manner, with a thickness in a range of, for example, about 2 nm to 5 nm, and may include a high k gate dielectric such as $HfO_2$. Before the high k gate dielectric is formed, an interface layer, e.g., an oxide formed by an oxidation process or deposition such as an Atomic Layer Deposition (ALD), may also be formed, with a thickness in a range of about 0.2 nm to 2 nm. The gate conductor layer 1073 may include a work function adjustment metal such as TiN, TaN, etc. and a gate conductive metal such as W, etc. A planarization process such as CMP may be performed on the deposited gate dielectric layer 1071 and gate conductor layer 1073, so that the layers may be left in the gate trench.

In this example, the p-type element and the n-type element are simultaneously formed on the substrate, and gate stacks of the p-type element and the n-type element may be formed respectively, for example, they have different work functions. For example, the above-mentioned formed gate conductor layer 1073 has an effective work function suitable for an n-type element. The gate conductor layer 1073 in the second element region may be removed by masking the first element region with a masking layer such as a photoresist (the gate dielectric layer 1071 may also be removed). Then, as shown in FIG. 23, a gate conductor layer 1075 for the p-type element is formed in the second element region (a gate dielectric layer is also formed when the gate dielectric layer 1071 is removed).

Figure 23:
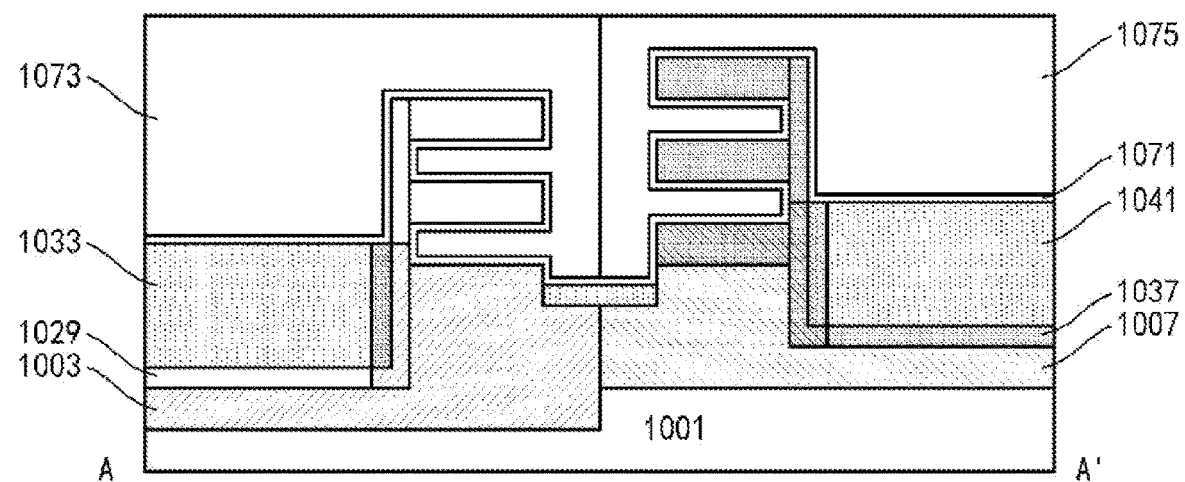

As shown in FIG. 23, the gate conductor layers of the current p-type element and n-type element are connected with each other, so that they may form a CMOS configuration. In addition, the gate conductor layers may be adjusted according to a layout design.

Figure 24:
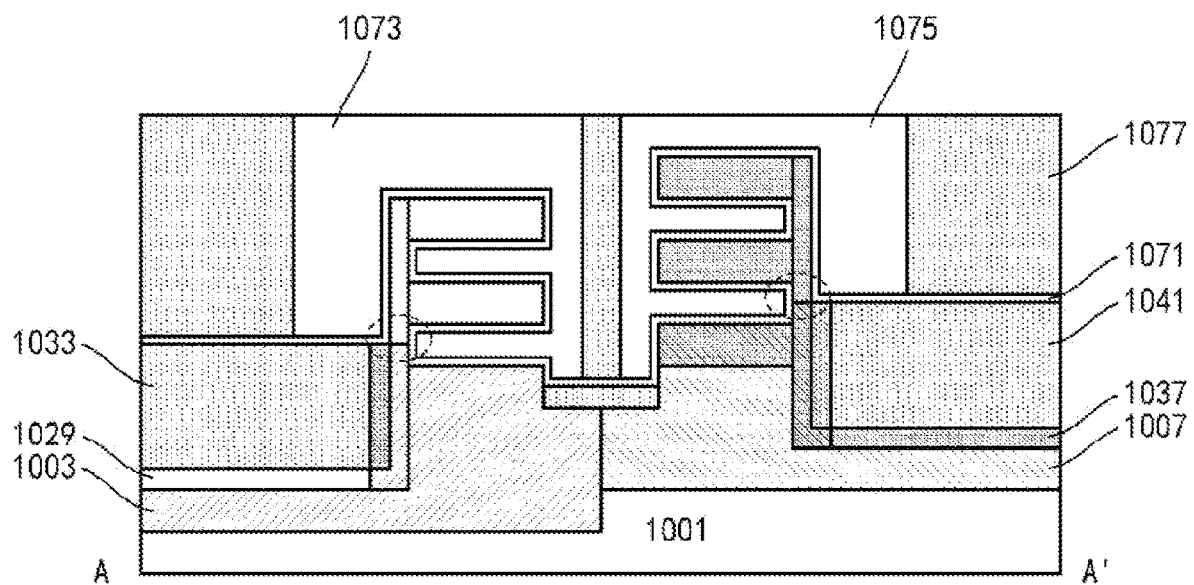

For example, as shown in FIG. 24, the gate conductor layer 1073 of the n-type element and the gate conductor layer 1075 of the p-type element may be separated from each other by using a photoresist, so as to achieve an electrical isolation therebetween. A gap caused by an adjustment of the gate conductor layers may be filled with a dielectric material 1077, such as an oxide, so as to achieve the electrical isolation.

As shown in a dotted line circle in the drawing, the gate stack is provided on both sides of a portion of the fin close to the PTS, so that the portion may be controlled from both sides by the gate stack, and thus a better on and off current control may be achieved. This is also one of reasons for a height adjustment of the top surface of the isolation layer.

The semiconductor apparatus according to embodiments of the present disclosure may be applied to various electronic devices. For example, an integrated circuit (IC) may be formed based on the semiconductor apparatus, and thus an electronic device may be constructed. Accordingly, the present disclosure further provides an electronic device including the semiconductor apparatus described above. The electronic device may further include a display screen cooperating with the integrated circuit, a wireless transceiver cooperating with the integrated circuit, and other components. The electronic device may include, for example, a smart phone, a computer, a tablet computer (PC), a wearable smart device, a mobile power supply, etc.

According to embodiments of the present disclosure, a method of manufacturing a System on Chip (SoC) is further provided. The method may include the above-mentioned method. In particular, a variety of elements may be integrated on a chip, at least some of which are manufactured according to the method of the present disclosure.

In the above description, technical details such as patterning and etching of each layer have not been described in detail. However, those skilled in the art should understand that various technical means may be used to form layers, regions, etc. of desired shapes. In addition, in order to form the same structure, those skilled in the art may further design a method that is not exactly the same as the method described above. In addition, although the various embodiments have been described above respectively, this does not mean that the measures in the various embodiments may not be advantageously used in combination.

Embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor apparatus, comprising a first element and a second element on a substrate, wherein the first element and the second element each comprise a comb-shaped structure, and the comb-shaped structure comprises:

a first portion extending in a vertical direction relative to the substrate; and at least one second portion extending from the first portion in a lateral direction relative to the substrate and spaced from the substrate, wherein a height of the second portion of the first element in the vertical direction is staggered with respect to a height of the second portion of the second element in the vertical direction, and wherein a material of the comb-shaped structure of the first element is different from a material of the comb-shaped structure of the second element.

2. The semiconductor apparatus according to claim 1, wherein the material of the comb-shaped structure of the first element comprises a silicon or III-V family semiconductor, and the material of the comb-shaped structure of the second element comprises a silicon germanium or germanium.

3. The semiconductor apparatus according to claim 1, wherein a surface of the second portion of the first element extending in the lateral direction is substantially coplanar with a corresponding surface of the second portion of the second element at a same height.

4. The semiconductor apparatus according to claim 1, wherein a surface of the second portion of the second element extending in the lateral direction is substantially coplanar with a corresponding surface of the second portion of the first element at a same height.

5. The semiconductor apparatus according to claim 1, wherein a number of the second portion of the first element is the same as a number of the second portion of the second element.

6. The semiconductor apparatus according to claim 1, wherein the first portion is formed in a form of a fin, and the second portion is formed in a form of a nanosheet.

7. The semiconductor apparatus according to claim 1, wherein the comb-shaped structure comprises a single crystal semiconductor material.

8. The semiconductor apparatus according to claim 1, wherein the second portion of the first element and the second portion of the second element extend toward each other or opposite to each other.

9. The semiconductor apparatus according to claim 1, wherein a spacing between adjacent second portions of the first element is substantially equal to a thickness of a corresponding second portion of the second element.

10. The semiconductor apparatus according to claim 1, wherein a spacing between adjacent second portions of the second element is substantially equal to a thickness of a corresponding second portion of the first element.

11. The semiconductor apparatus according to claim 1, wherein a second portion of the first element closest to the substrate and a surface of the substrate have a first spacing therebetween, and a semiconductor layer with a thickness substantially equal to the first spacing is arranged between a second portion of the second element closest to the substrate and the surface of the substrate and located on the surface of the substrate, wherein the semiconductor layer comprises a material substantially the same as a material of the second portion of the second element.

12. The semiconductor apparatus according to claim 1, wherein the first element and the second element each further comprise:

source/drain portions arranged on both sides of the comb-shaped structure in a first direction, wherein the source/drain portions are connected with the comb-shaped structure; and a gate stack intersecting the comb-shaped structure in a second direction, wherein the second direction intersects with the first direction.

13. The semiconductor apparatus according to claim 12, further comprising:

a spacer formed on a side wall of the gate stack, wherein an inner side wall of a portion of the spacer above the second portion is substantially aligned with an inner side wall of a portion of the spacer below the second portion in the vertical direction.

14. The semiconductor apparatus according to claim 12, wherein the first portion of each of the first element and the second element extends to be connected to the substrate.

15. The semiconductor apparatus according to claim 14, further comprising:

a punch-through stop portion arranged in a portion of the first portion close to the substrate in each of the first element and the second element; and a doped region, in the substrate, in contact with the punch-through stop portion.

16. The semiconductor apparatus according to claim 15, further comprising:

an isolation layer surrounding the punch-through stop portion and the doped region, wherein the gate stack is formed on the isolation layer.

17. The semiconductor apparatus according to claim 1, wherein the first element and the second element are elements of different conductive types.

18. The semiconductor apparatus according to claim 17, wherein the semiconductor apparatus is a complementary metal oxide semiconductor CMOS configuration.

19. An electronic device comprising the semiconductor apparatus according to claim 1.

20. The electronic device according to claim 19, wherein the electronic device comprises a smart phone, a computer, a tablet computer, an artificial intelligence device, a wearable device or a mobile power supply.

21. A method of manufacturing a semiconductor apparatus, comprising:

arranging an alternating stack of at least one first active layer and at least one second active layer on a substrate;

forming a first trench extending in a first direction in the stack, wherein a side wall of the first active layer is exposed in the first trench;

forming a third active layer connected with the exposed side wall of the first active layer on a side wall of the first trench;

forming in the stack a second trench spaced from the first trench in a second direction intersecting the first direction and extending in the first direction, wherein a side wall of the second active layer is exposed in the second trench;

forming a fourth active layer connected with the exposed side wall of the second active layer on a side wall of the second trench;

forming in the stack a third trench extending in the first direction between the first trench and the second trench, so that the stack is separated into a first sub stack between the first trench and the third trench and a second sub stack between the second trench and the third trench;

removing, via the third trench, the second active layer from the first sub stack by a selective etching so that the first active layer and the third active layer form a first comb-shaped structure; and removing, via the third trench, the first active layer from the second sub stack by the selective etching, so that the second active layer and the fourth active layer form a second comb-shaped structure.

22. The method according to claim 21, wherein in a case that an uppermost layer of the stack is the second active layer, before forming the first trench, the method further comprises performing a local selective etching on the second active layer of the uppermost layer, so that the second active layer of the uppermost layer is removed in a region between the first trench and the third trench, while the second active layer of the uppermost layer is retained in a region between the second trench and the third trench.

23. The method according to claim 21, wherein the first trench enters the substrate, so that the third active layer is further formed on a surface of the substrate exposed in the first trench; and the second trench enters the substrate, so that the fourth active layer is further formed on a surface of the substrate exposed in the second trench.

24. The method according to claim 23, further comprising:

forming a first isolation layer, a second isolation layer and a third isolation layer at bottom portions of the first trench, the second trench and the third trench, respectively;

forming, on the first isolation layer, the second isolation layer and the third isolation layer, a strip sacrificial gate extending in the second direction and intersecting the sub stacks;

selectively etching the sub stacks by using the sacrificial gate as a mask;

forming, on two opposite sides of the etched sub stacks in the first direction, a semiconductor layer for forming source/drain portions; and replacing the sacrificial gate with a gate stack.

25. The method according to claim 24, wherein, before forming the first isolation layer, the method further comprises: forming a first dopant source layer on the third active layer via the first trench, after forming the first isolation layer, the method further comprises: selectively etching the first dopant source layer by using the first isolation layer as a mask, before forming the second isolation layer, the method further comprises: forming a second dopant source layer on the fourth active layer via the second trench, after forming the second isolation layer, the method further comprises: selectively etching the second dopant source layer by using the second isolation layer as a mask, and the method further comprises: driving dopants in the first dopant source layer and the second dopant source layer into the third active layer and the fourth active layer respectively, so as to form punch-through stop portions.

26. The method according to claim 25, further comprising:

forming, in the substrate, a first well region between the first trench and the third trench, and forming, in the substrate, a first well region between the second trench and the third trench.

27. The method according to claim 21, wherein when removing the second active layer from the first sub stack, the method further comprises forming a protective layer via the third trench to cover the second active layer in the second sub stack, and wherein when removing the first active layer from the second sub stack, the method further comprises forming a protective layer via the third trench to cover the first active layer in the first sub stack.

28. The method according to claim 21, wherein the first active layer and the second active layer are provided by an epitaxial growth.

* * * * *